(12) United States Patent
Kudou et al.

(10) Patent No.: US 9,362,370 B2
(45) Date of Patent: Jun. 7, 2016

(54) SILICON CARBIDE SEMICONDUCTOR DEVICE HAVING NITROGEN-CONTAINING SILICON ALLOY FOR OHMIC CONTACT TO P-TYPE IMPURITY REGION

(71) Applicant: PANASONIC CORPORATION, Osaka (JP)

(72) Inventors: Chiaki Kudou, Toyama (JP); Tsutomu Kiyosawa, Toyama (JP); Takayuki Wakayama, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/378,313

(22) PCT Filed: Jul. 9, 2013

(86) PCT No.: PCT/JP2013/004246
§ 371 (c)(1),
(2) Date: Aug. 12, 2014

(87) PCT Pub. No.: WO2014/068813
PCT Pub. Date: May 8, 2014

(65) Prior Publication Data
US 2015/0001553 A1   Jan. 1, 2015

(30) Foreign Application Priority Data

Oct. 30, 2012  (JP) ................................ 2012-238797

(51) Int. Cl.
*H01L 29/36* (2006.01)
*H01L 29/66* (2006.01)
(Continued)

(52) U.S. Cl.
CPC .............. *H01L 29/36* (2013.01); *H01L 21/046* (2013.01); *H01L 21/049* (2013.01);
(Continued)

(58) Field of Classification Search
None
See application file for complete search history.

(56) References Cited

U.S. PATENT DOCUMENTS 6,573,534 B1   6/2003  Kumar et al.
6,580,125 B2 *  6/2003  Kitabatake et al. ........... 257/335
(Continued)

FOREIGN PATENT DOCUMENTS

CN  101246899 A  8/2008
CN  101578705 A  11/2009
(Continued)

OTHER PUBLICATIONS

International Search Report issued in International Application No. PCT/JP2013/004246 with Date of mailing Oct. 15, 2013, with English Translation.

*Primary Examiner* — Erik Kielin
(74) *Attorney, Agent, or Firm* — McDermott Will & Emery LLP

(57) ABSTRACT

A semiconductor device includes: a first silicon carbide semiconductor layer; a p-type first impurity region provided in the first silicon carbide semiconductor layer; and a first ohmic electrode forming ohmic contact with the p-type first impurity region. The first ohmic electrode is a silicon alloy containing nitrogen, an average concentration of nitrogen in the first ohmic electrode is higher than or equal to one half of an average concentration of nitrogen in the first impurity region, and an average concentration of a p-type impurity in a portion of the first ohmic electrode except a portion of the first ohmic electrode within 50 nm from an interface between the first ohmic electrode and the first impurity region is equal to or lower than $3.0 \times 10^{18}$ cm$^{-3}$.

11 Claims, 28 Drawing Sheets

(51) Int. Cl.
*H01L 29/04* (2006.01)
*H01L 29/78* (2006.01)
*H01L 29/45* (2006.01)
*H01L 29/16* (2006.01)
*H01L 21/04* (2006.01)

(52) U.S. Cl.
CPC ......... *H01L 21/0485* (2013.01); *H01L 29/045* (2013.01); *H01L 29/1608* (2013.01); *H01L 29/45* (2013.01); *H01L 29/66068* (2013.01); *H01L 29/7827* (2013.01)

(56) References Cited

U.S. PATENT DOCUMENTS

| | | | |
|---|---|---|---|
| 2001/0046757 A1 | 11/2001 | Takahashi et al. | |
| 2003/0020136 A1 | 1/2003 | Kitabatake et al. | |
| 2004/0021174 A1 | 2/2004 | Kobayashi | |
| 2004/0217375 A1 | 11/2004 | Yokogawa et al. | |
| 2005/0001217 A1 | 1/2005 | Kusumoto et al. | |
| 2009/0242901 A1* | 10/2009 | Matocha et al. | 257/77 |
| 2010/0013010 A1 | 1/2010 | Akiyama et al. | |
| 2010/0055858 A1 | 3/2010 | Hayashi et al. | |
| 2012/0146055 A1 | 6/2012 | Mitani et al. | |
| 2012/0153303 A1 | 6/2012 | Uchida | |
| 2012/0286290 A1 | 11/2012 | Uchida | |
| 2013/0062624 A1* | 3/2013 | Tsuchiya | H01L 29/0839 257/77 |
| 2013/0082285 A1 | 4/2013 | Kudou et al. | |

FOREIGN PATENT DOCUMENTS

| | | |
|---|---|---|
| CN | 102668094 A | 9/2012 |
| JP | 01-094672 A | 4/1989 |
| JP | 09-082663 A | 3/1997 |
| JP | 10-308510 A | 11/1998 |
| JP | 2001-185507 A | 7/2001 |
| JP | 2001-332508 A | 11/2001 |
| JP | 2003-318396 A | 11/2003 |
| JP | 3527496 B2 | 5/2004 |
| JP | 2005-039257 A | 2/2005 |
| JP | 3773489 B2 | 5/2006 |
| JP | 2010-027719 A | 2/2010 |
| JP | 2012-124329 A | 6/2012 |
| WO | 2011/027525 A1 | 3/2011 |
| WO | 2011/027540 A1 | 3/2011 |
| WO | 2012/032735 A1 | 3/2012 |

* cited by examiner (a)

(b)

(a)

(b)

(a)

(b)

(a)

(b)

(a)

(b)

(a)

(b)

(b)

(b)

(a)

(b)

(a)

(b)

SILICON CARBIDE SEMICONDUCTOR DEVICE HAVING NITROGEN-CONTAINING SILICON ALLOY FOR OHMIC CONTACT TO P-TYPE IMPURITY REGION

RELATED APPLICATIONS

This application is a national phase of International Application No. PCT/JP2013/004246, filed on Jul. 9, 2013, which in turn claims the benefit of Japanese Application No. 2012-238797, filed on Oct. 30, 2012, the disclosures of which Applications are incorporated by reference herein.

TECHNICAL FIELD

The present disclosure relates to semiconductor devices and methods for fabricating the same, and specifically relates to a silicon carbide semiconductor device and a method for fabricating the same.

BACKGROUND ART

Power semiconductor devices are semiconductor elements that withstand high voltage and high current, and preferably have low loss. Power semiconductor devices have recently been used in the form of high-speed inverters. When the power semiconductor devices are used in such a manner, a need exists for high-speed operation.

A silicon (Si) semiconductor is used as a material of the power semiconductor devices. Meanwhile, in recent years, attention has been directed toward power semiconductor devices of silicon carbide (SiC), and development for such power semiconductor devices is underway.

The dielectric breakdown voltage of silicon carbide itself is an order of magnitude higher than that of silicon. For this reason, when a power semiconductor device is fabricated using silicon carbide, a reverse voltage can be maintained even in a situation where a depletion layer at the pn junction or at the Schottky junction is thin. Thus, a high-breakdown-voltage and low-loss power semiconductor device having low on-resistance can be achieved by reducing the device thickness and increasing the doping concentration of a silicon carbide layer. The saturated electron velocity of silicon carbide is about twice as high as that of silicon. Thus, high-speed operation can be achieved.

Examples of power semiconductor devices of silicon carbide include a planar-type metal-insulator-semiconductor field-effect transistor (hereinafter abbreviated as MISFET). The planar-type MISFET typically includes an n⁻-type epitaxial layer having p-type body regions each including an n⁺-type source region. The source region forms ohmic contact with a source electrode. A region of the n⁻-type epitaxial layer surrounding each body region forms a junction field-effect transistor (JFET) region. The source electrode has the same potential as the body region.

Preferably, in a planar-type MISFET, a change in potential of a body region instantaneously follows a change in potential of a source electrode. If the contact resistance between the source electrode and the body region is high, a delay unfortunately occurs after the potential of the source electrode changes and until the potential of an end portion of the body region changes. Such a potential change delay causes a delay in switching time, and is significantly problematic for power semiconductor devices requiring a higher operating speed.

To reduce the contact resistance between a source electrode and a body region of a planar-type MISFET, the body region includes a contact region heavily doped with p-type impurities, and the source electrode and the body region are electrically connected together through the contact region (see, for example, PATENT DOCUMENT 1).

It has been examined to allow the contact region to have an impurity profile in which the impurity concentration in the depth direction is substantially fixed, i.e., a box profile. To further reduce the contact resistance between the source electrode and the contact region, a method has been studied in which after impurities have been implanted into a silicon carbide semiconductor layer, the surface of the silicon carbide semiconductor layer is removed by, e.g., hydrogen etching to allow the peak of the impurity concentration to be in the vicinity of the surface of the contact region (see, for example, PATENT DOCUMENT 2).

CITATION LIST

Patent Documents

PATENT DOCUMENT 1: Japanese Unexamined Patent Publication No. 2005-39257

PATENT DOCUMENT 2: Japanese Unexamined Patent Publication No. 2001-332508

SUMMARY OF THE INVENTION

Technical Problem

In the conventional silicon carbide semiconductor device, while it has been examined to reduce the contact resistance between the source electrode and the contact region, the resistance of the source electrode itself has not been examined.

The present inventors found that when an ohmic electrode is formed on a silicon carbide semiconductor layer containing a p-type impurity at a high concentration, the sheet resistance of the ohmic electrode itself increases. Even when the contact resistance between a source electrode and a contact region is low, the source electrode itself having high sheet resistance delays a change in potential of an end portion of a body region to deteriorate the switching performance of a silicon carbide semiconductor element.

The present disclosure achieves a silicon carbide semiconductor device including an ohmic electrode forming ohmic contact with a p-type impurity region and having low sheet resistance.

Solution to the Problem

A semiconductor device according to an aspect of the present disclosure includes: a first silicon carbide semiconductor layer; a p-type first impurity region provided in the first silicon carbide semiconductor layer; and a first ohmic electrode forming ohmic contact with the p-type first impurity region. The first ohmic electrode is a silicon alloy containing nitrogen, an average concentration of nitrogen in the first ohmic electrode is higher than or equal to one half of an average concentration of nitrogen in the first impurity region, and an average concentration of a p-type impurity in a portion of the first ohmic electrode except a portion of the first ohmic electrode within 50 nm from an interface between the first ohmic electrode and the first impurity region is equal to or lower than $3.0 \times 10^{18}$ cm$^{-3}$.

Advantages of the Invention

The semiconductor device of the present disclosure and the method for fabricating the same can provide a silicon carbide semiconductor device including an ohmic electrode that forms ohmic contact with a p-type impurity region and has a low sheet resistance.

DESCRIPTION OF EMBODIMENTS

A p-type region herein denotes a region in which the concentration of p-type impurities is higher than that of n-type impurities, and which is of a p-type conductivity. An n-type region denotes a region in which the concentration of n-type impurities is higher than that of p-type impurities, and which is of an n-type conductivity. When the impurity concentration needs to be relatively expressed, the symbol + or − is used. For example, the impurity concentration satisfies the relationship indicated by ++>+>−.

A silicon carbide semiconductor layer includes, not only a silicon carbide semiconductor layer epitaxially grown on the principal surface of a substrate, but also the substrate made of a silicon carbide semiconductor when used as a semiconductor. The substrate on which the silicon carbide semiconductor layer is epitaxially grown is not limited to a silicon carbide substrate, and as long as a silicon carbide semiconductor layer can be formed on the substrate, the substrate may be a semiconductor substrate made of, for example, silicon, or an insulative substrate made of, for example, sapphire.

First, the relationship between the resistance of a metal silicide and the impurity concentration, which was found by the present inventors, will be described. Various silicon carbide semiconductor layers having different impurity concentrations were caused to react with a metal, and metal silicides being silicon alloys were thus formed. The impurity distributions and sheet resistances were compared among the metal silicides.

Specifically, a silicon carbide semiconductor layer containing nitrogen at a concentration of about $1 \times 10^{16}$ cm$^{-3}$ (atom·cm$^{-3}$) was epitaxially grown on a silicon carbide substrate into which nitrogen being an impurity is introduced to a concentration of about $1 \times 10^{18}$ cm$^{-3}$. Aluminum being a p-type impurity and nitrogen being an n-type impurity were implanted into the silicon carbide semiconductor layer such that the silicon carbide semiconductor layer has a predetermined aluminum concentration and a predetermined nitrogen concentration. The impurities were implanted into the silicon carbide semiconductor layer several times, and in the implantation, the dose energy and dose amount were controlled to achieve a box profile in which the impurity concentration in the depth direction is substantially fixed. After the impurity implantation, annealing was performed at a temperature of about 1700° C. to activate the impurities. After the activation of the impurities, nickel was deposited, in the form of a metal layer, on the silicon carbide semiconductor layer to a thickness of about 100 nm, and annealing was performed at a temperature of about 950° C. to form a metal silicide layer made of nickel silicide (NiSi). Then, an unreacted portion of the nickel was removed.

Figure 1:
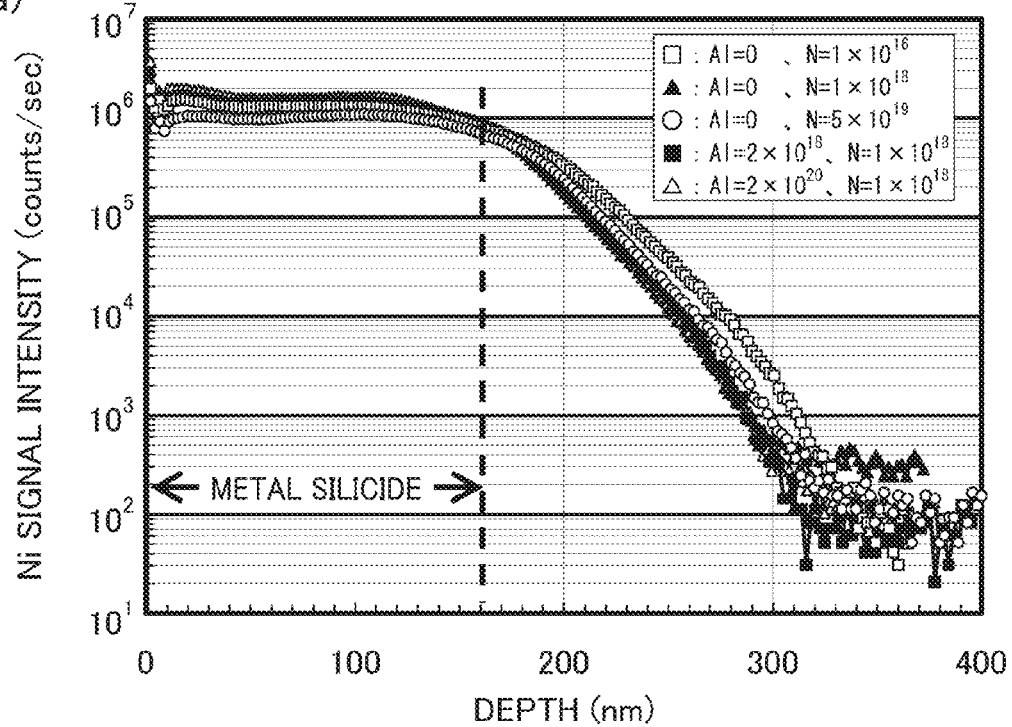
FIGS. 1(a) and 1(b) are graphs illustrating the distribution of nickel in a nickel silicide layer.
Figure 1:
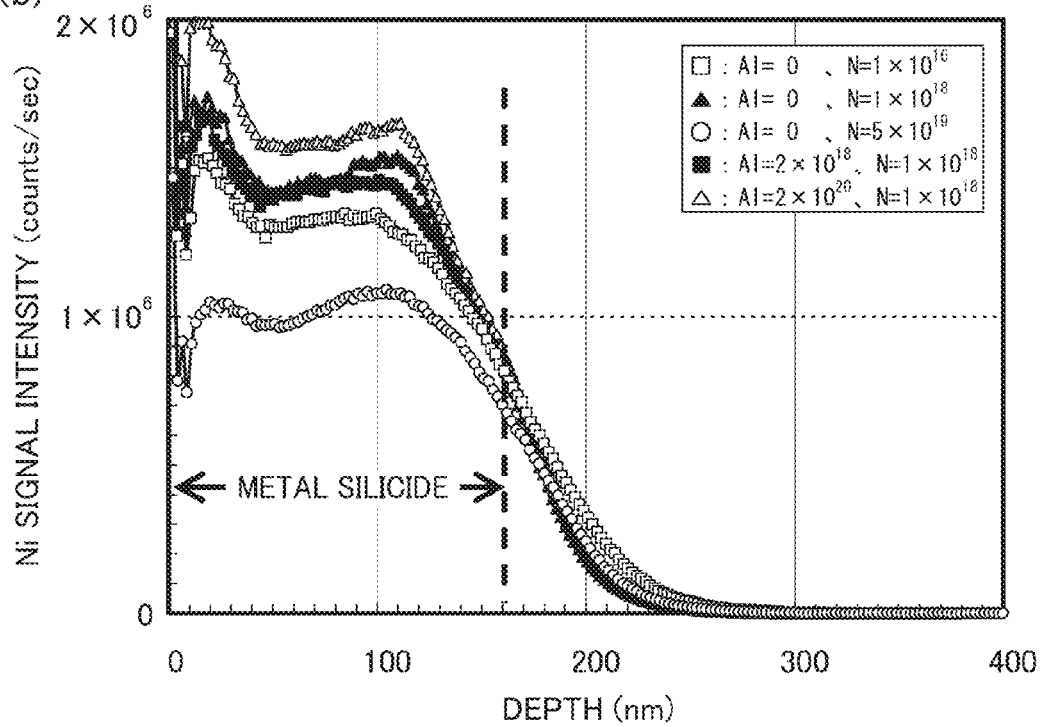

First, the composition profile through each silicon carbide semiconductor layer on which the metal silicide layer was formed was examined. FIGS. 1(*a*) and 1(*b*) each illustrate the thicknesses of the metal silicide layers determined by secondary ion mass spectrometry (SIMS). In FIG. 1(*a*), the vertical axis is shown on a logarithmic scale, and in FIG. 1(*b*), the vertical axis is shown on a linear scale. In each of FIGS. 1(*a*) and 1(*b*), the measurement results of a sample into which aluminum ions were not implanted and which had a nitrogen concentration of $1 \times 10^{16}$ cm$^{-3}$ are plotted with white squares, the measurement results of a sample into which aluminum ions were not implanted and which had a nitrogen concentration of $1 \times 10^{18}$ cm$^{-3}$ are plotted with black triangles, the measurement results of a sample into which aluminum ions were not implanted and which had a nitrogen concentration of $5 \times 10^{19}$ cm$^{-3}$ are plotted with white circles, the measurement results of a sample which had an aluminum concentration of $2 \times 10^{18}$ cm$^{-3}$ and a nitrogen concentration of $1 \times 10^{18}$ cm$^{-3}$ are plotted with black squares, and the measurement results of a sample which had an aluminum concentration of $2 \times 10^{20}$ cm$^{-3}$ and a nitrogen concentration of $1 \times 10^{18}$ cm$^{-3}$ are plotted with white triangles.

As illustrated in FIGS. 1(*a*) and 1(*b*), certain differences in nickel signal intensity are observed among the samples. Meanwhile, as illustrated in FIG. 1(*b*), even when the silicon carbide semiconductor layers for forming the metal silicide layer contained different impurities and had different impurity concentrations, the nickel signal intensity peaks of the samples were observed at substantially the same depths. The nickel profiles in the depth direction do not significantly vary. This shows that independently of the types and concentrations of the impurities contained in each silicon carbide semiconductor layer, metal silicide layers having substantially the same thickness are formed. Here, the location at which the signal intensity is 60% of one of the peaks at the deepest location is determined to be the interface between the metal silicide layer and the silicon carbide semiconductor layer, a portion of each sample shallower than the interface is referred to as the metal silicide layer, and a portion of the sample deeper than the interface is referred to as an underlying layer. In the examples in FIGS. 1(*a*) and 1(*b*), a portion of the sample from the sample surface to a depth of about 160 nm is referred to as the metal silicide layer, and a portion of the sample deeper than about 160 nm is referred to as the underlying layer. X-ray diffraction showed that the metal silicide layer is Ni$_2$Si.

Figure 2:
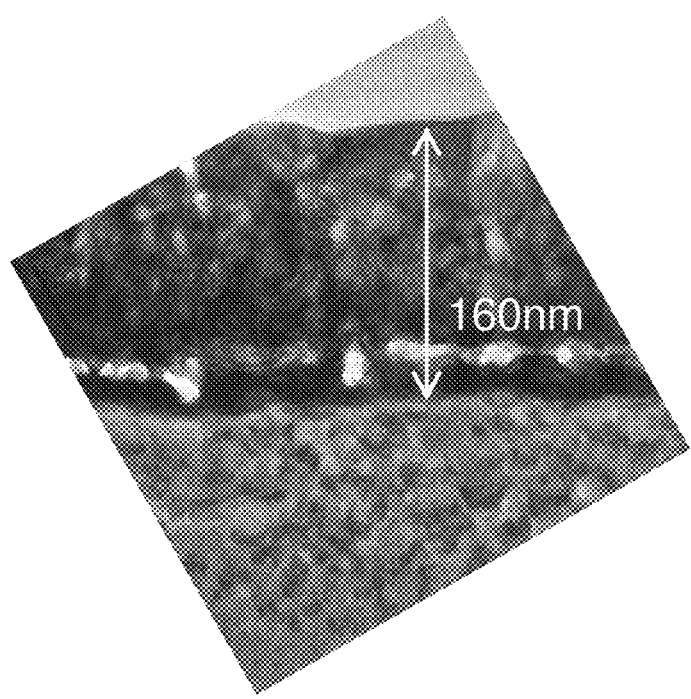
FIG. 2 is an electron microscope image illustrating a cross section of the nickel silicide layer.

FIG. 2 illustrates the result of observing a cross section of a sample including a metal silicide layer with a transmission electron microscope (TEM). Aluminum ions were not implanted into a silicon carbide semiconductor layer before silicidation, and the sample had a nitrogen concentration of $1 \times 10^{18}$ cm$^{-3}$. FIG. 2 shows that the interface between the metal silicide layer and the silicon carbide semiconductor layer was located at a depth of about 160 nm from the sample surface.

Figure 3:
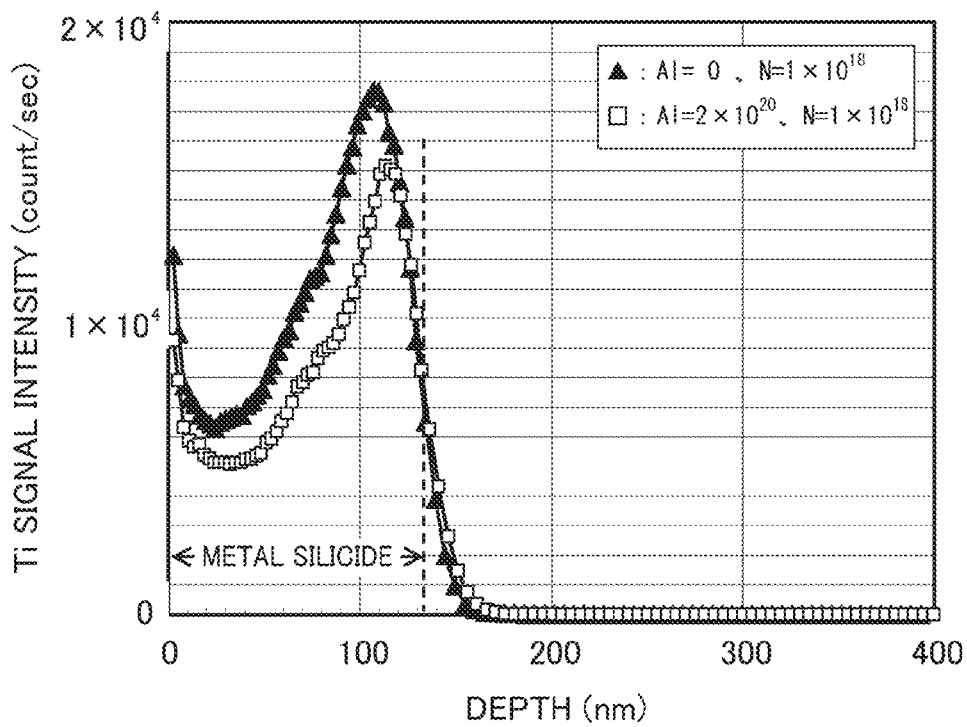
FIG. 3 is a graph illustrating the distribution of titanium in a titanium silicide layer.

While an example in which the metal silicide layer is a nickel silicide layer was described, a metal silicide layer containing another metal also has similar tendencies. FIG. 3 illustrates the thicknesses of titanium silicide (TiSi) layers determined when instead of nickel, titanium was deposited on each of silicon carbide semiconductor layers, and was annealed. The underlying silicon carbide semiconductor layers were formed in a manner similar to that when nickel was deposited. The thickness of titanium was about 150 nm, and the annealing temperature was about 950° C.

In FIG. 3, the measurement results of a sample into which aluminum ions were not implanted and which had a nitrogen concentration of $1 \times 10^{18}$ cm$^{-3}$ are plotted with black triangles, and the measurement results of a sample which had an aluminum concentration of $2 \times 10^{20}$ cm$^{-3}$ and a nitrogen concentration of $1 \times 10^{18}$ cm$^{-3}$ are plotted with white squares.

As illustrated in FIG. 3, even when the silicon carbide semiconductor layers for forming a titanium silicide layer contained different impurities and had different impurity concentrations, the titanium signal intensity peaks of the samples were observed at substantially the same depths. The titanium profiles in the depth direction do not significantly vary. This shows that in the case of titanium, similarly to the case of nickel, even when the silicon carbide semiconductor layers on each of which a metal silicide layer had not been formed yet had different impurity concentrations, metal silicide layers having substantially the same thickness are formed. Also when the metal silicide layer was a titanium silicide layer, the location at which the signal intensity is 60% of one of the peaks at the deepest location was determined to be the interface between the metal silicide layer and the silicon carbide semiconductor layer. In the example in FIG. 3, the interface between the metal silicide layer and the silicon carbide semiconductor layer was located at a depth of about 130 nm from the sample surface.

Figure 4:
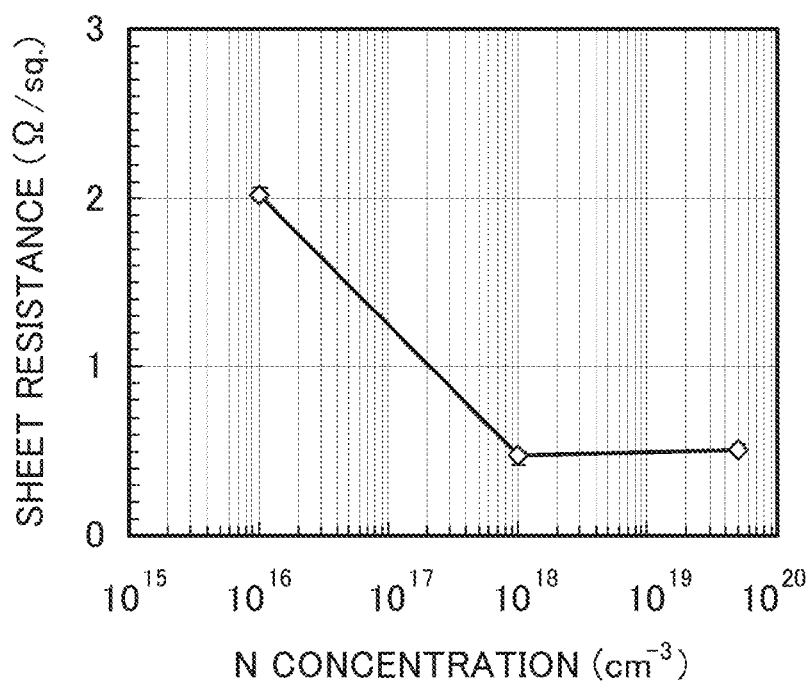
FIG. 4 is a graph illustrating the relationship between the nitrogen concentration in a silicon carbide semiconductor layer before nickel silicidation and the sheet resistance of the nickel silicide layer.

FIG. 4 illustrates the relationship between the nitrogen concentration in a silicon carbide semiconductor layer before nickel silicidation and the sheet resistance of the metal silicide layer. FIG. 4 illustrates three results obtained by measuring the sheet resistance of the metal silicide layer when the nitrogen concentration in the silicon carbide semiconductor layer was $1.0 \times 10^{16}$ cm$^{-3}$, when the nitrogen concentration in the silicon carbide semiconductor layer was $1.0 \times 10^{18}$ cm$^{-3}$, and when the nitrogen concentration in the silicon carbide semiconductor layer was $5.0 \times 10^{19}$ cm$^{-3}$. The nitrogen concentrations in FIG. 4 are calculated values determined based on the amount of nitrogen implanted. When the nitrogen concentration in the silicon carbide semiconductor layer is higher than or equal to $1.0 \times 10^{18}$ cm$^{-3}$, the sheet resistance of the metal silicide layer was reduced from about 2 Ω/sq. to about ¼, i.e., about 0.5 Ω/sq.

Figure 5:
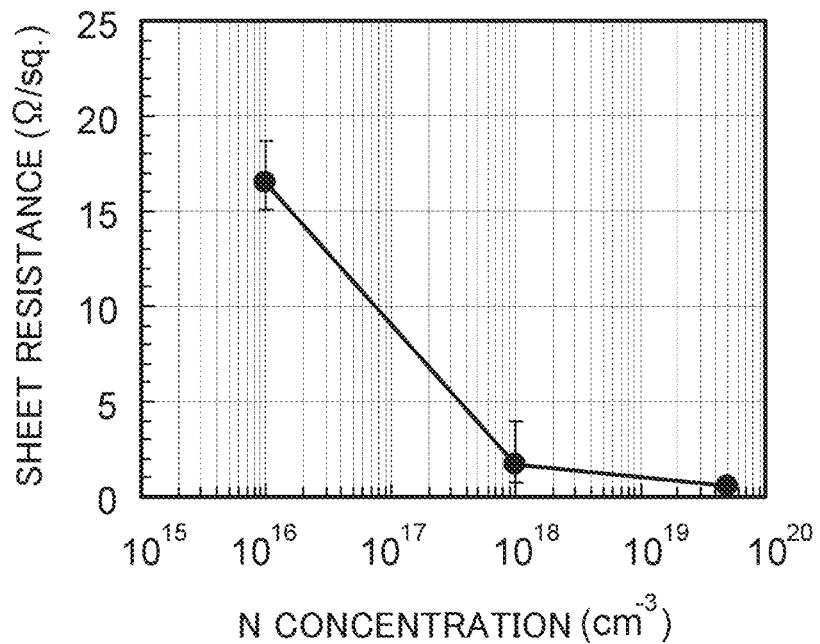
FIG. 5 is a graph illustrating the relationship between the nitrogen concentration in the silicon carbide semiconductor layer before titanium silicidation and the sheet resistance of the titanium silicide layer.

FIG. 5 illustrates the relationship between the nitrogen concentration in a silicon carbide semiconductor layer on which a metal silicide layer made of titanium silicide had not been formed yet and the sheet resistance of the metal silicide layer. FIG. 5 illustrates three results obtained by measuring the sheet resistance of the metal silicide layer when the nitrogen concentration in the silicon carbide semiconductor layer on which the titanium silicide layer had not been formed yet was $1.0 \times 10^{16}$ cm$^{-3}$, when the nitrogen concentration in the silicon carbide semiconductor layer on which the titanium silicide layer had not been formed yet was $1.0 \times 10^{18}$ cm$^{-3}$, and when the nitrogen concentration in the silicon carbide semiconductor layer on which the titanium silicide layer had not been formed yet was $5.0 \times 10^{19}$ cm$^{-3}$. The nitrogen concentrations in FIG. 5 are calculated values determined based on the amount of nitrogen implanted. When the nitrogen concentration in the silicon carbide semiconductor layer on which the metal silicide layer had not been formed yet was higher than or equal to $1.0 \times 10^{18}$ cm$^{-3}$, the sheet resistance of the titanium silicide layer was significantly reduced from about 17 Ω/sq. to about 0.5-1.5 Ω/sq.

Figure 6:
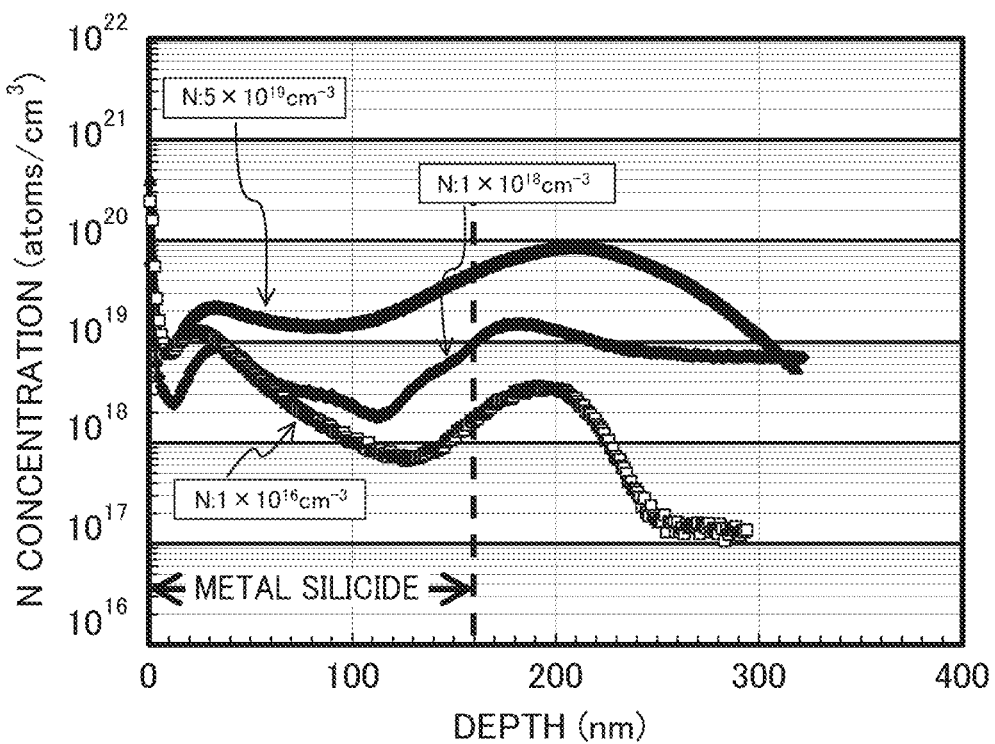
FIG. 6 is a graph illustrating the distribution of nitrogen in the nickel silicide layer.

FIG. 6 illustrates the nitrogen (N) concentration in each of metal silicide layers made of nickel silicide, which was determined by SIMS (SC-Ultra made by AMETEK Co., Ltd). Cesium (Cs) ions were used as primary ions for SIMS analysis, and the primary ion acceleration voltage by which primary ions were accelerated was 1 kV. The SIMS analysis was performed on a sample including a silicon carbide semiconductor layer having a nitrogen concentration of $1 \times 10^{16}$ cm$^{-3}$ before the formation of a metal silicide layer, a sample including a silicon carbide semiconductor layer having a nitrogen concentration of $1 \times 10^{18}$ cm$^{-3}$ before the formation of a metal silicide layer, and a sample including a silicon carbide semiconductor layer having a nitrogen concentration of $5 \times 10^{19}$ cm$^{-3}$ before the formation of a metal silicide layer. With increasing nitrogen concentration in the silicon carbide semiconductor layer before silicidation, the nitrogen concentration at the interface between the metal silicide layer and the underlying layer increases. The nitrogen concentration in the metal silicide layer gradually decreases from the side of the metal silicide layer near the interface between the metal silicide layer and the underlying layer, then again increases, and has a peak in the vicinity of the surface of the metal silicide layer. The average nitrogen concentration in the metal silicide layer is about ½ of the average nitrogen concentration in the underlying layer. The reason for this may be that the volume of the metal silicide layer was about twice as large as that of the silicon carbide semiconductor layer before silicidation.

The nitrogen concentration in the outermost surface of the metal silicide layer is very high, which may be caused by environmental pollution. For this reason, when a maximum value and an average value of the nitrogen concentrations are calculated below, data on the outermost surface are not used.

Figure 7:
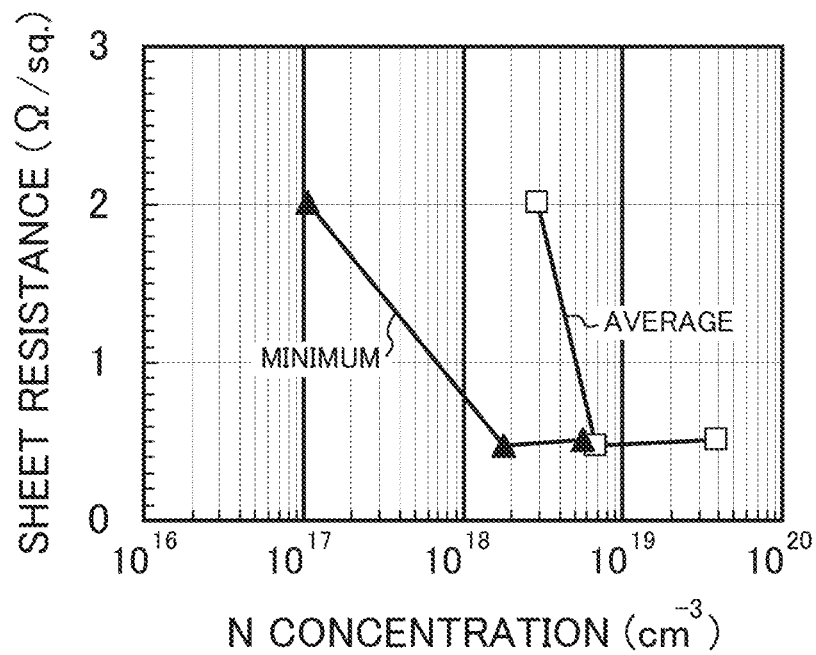
FIG. 7 is a graph illustrating the relationship between the nitrogen concentration in the nickel silicide layer and the sheet resistance of the nickel silicide layer.

FIG. 7 illustrates the relationship between the nitrogen concentration in a metal silicide layer made of nickel silicide, which was measured by SIMS, and the sheet resistance of the metal silicide layer. FIG. 7 illustrates three results obtained by measuring the sheet resistance of the metal silicide layer when the average nitrogen concentration in the metal silicide layer was $3.0 \times 10^{18}$ cm$^{-3}$, when the average nitrogen concentration in the metal silicide layer was $6.9 \times 10^{18}$ cm$^{-3}$, and when the average nitrogen concentration in the metal silicide layer was $3.9 \times 10^{19}$ cm$^{-3}$. FIG. 7 further illustrates three results obtained by measuring the sheet resistance of the metal silicide layer when the minimum nitrogen concentration in the metal silicide layer was $1.1 \times 10^{17}$ cm$^{-3}$, when the minimum nitrogen concentration in the metal silicide layer was $1.8 \times 10^{18}$ cm$^{-3}$, and when the minimum nitrogen concentration in the metal silicide layer was $5.6 \times 10^{18}$ cm$^{-3}$. When the average nitrogen concentration in the metal silicide layer is higher than or equal to $6.9 \times 10^{18}$ cm$^{-3}$, or when the minimum nitrogen concentration therein is higher than or equal to $1.8 \times 10^{18}$ cm$^{-3}$, the sheet resistance of the metal silicide layer is lower. Note that the average nitrogen concentration was calculated by integrating the concentration multiplied by the depth from the point of measurement to the next point of measurement over the entire region of the metal silicide layer in a SIMS depth profile and dividing the resultant value by the thickness of the whole metal silicide layer.

As such, what is important to reduce the sheet resistance of the metal silicide layer is that the silicon carbide semiconductor layer on which a metal silicide layer has not been formed yet contains nitrogen at a concentration higher than or equal to a certain concentration, and the formed metal silicide layer itself contains nitrogen at a concentration higher than or equal to a certain concentration.

In spite of this, nitrogen is an n-type impurity, and the p-type silicon carbide semiconductor layer contains a p-type impurity at a concentration that is higher than the nitrogen concentration. For this reason, the sheet resistances of metal silicides on silicon carbide semiconductor layers each containing a p-type impurity were determined.

Figure 8:
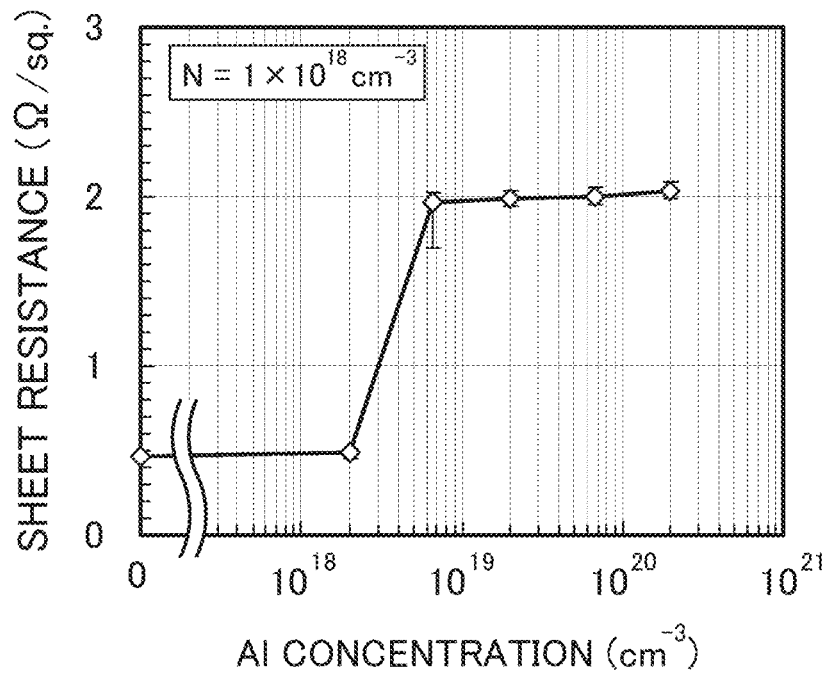
FIG. 8 is a graph illustrating the relationship between the aluminum concentration in the silicon carbide semiconductor layer before nickel silicidation and the sheet resistance of the nickel silicide layer.

FIG. 8 illustrates the relationship between the p-type impurity concentration in a silicon carbide semiconductor layer before nickel silicidation and the sheet resistance of the metal silicide layer. The p-type impurity was aluminum, and the nitrogen concentration in the silicon carbide semiconductor layer was $1 \times 10^{18}$ cm$^{-3}$. FIG. 8 illustrates six results obtained by measuring the sheet resistance of the metal silicide layer when the aluminum concentration in the silicon carbide semiconductor layer was zero, when the aluminum concentration in the silicon carbide semiconductor layer was $2.0 \times 10^{18}$ cm$^{-3}$, when the aluminum concentration in the silicon carbide semiconductor layer was $6.7 \times 10^{18}$ cm$^{-3}$, when the aluminum concentration in the silicon carbide semiconductor layer was $2.0 \times 10^{19}$ cm$^{-3}$, when the aluminum concentration in the silicon carbide semiconductor layer was $6.7 \times 10^{19}$ cm$^{-3}$, and when the aluminum concentration in the silicon carbide semiconductor layer was $2.0 \times 10^{20}$ cm$^{-3}$. The aluminum concentration and the nitrogen concentration in FIG. 8 are calculated values determined based on the amount of aluminum implanted and the amount of nitrogen implanted, respectively. When the aluminum concentration in the silicon carbide semiconductor layer on which the metal silicide layer had not been formed yet is equal to or lower than $2.0 \times 10^{18}$ cm$^{-3}$, the sheet resistance of the metal silicide layer is lower.

Figure 9:
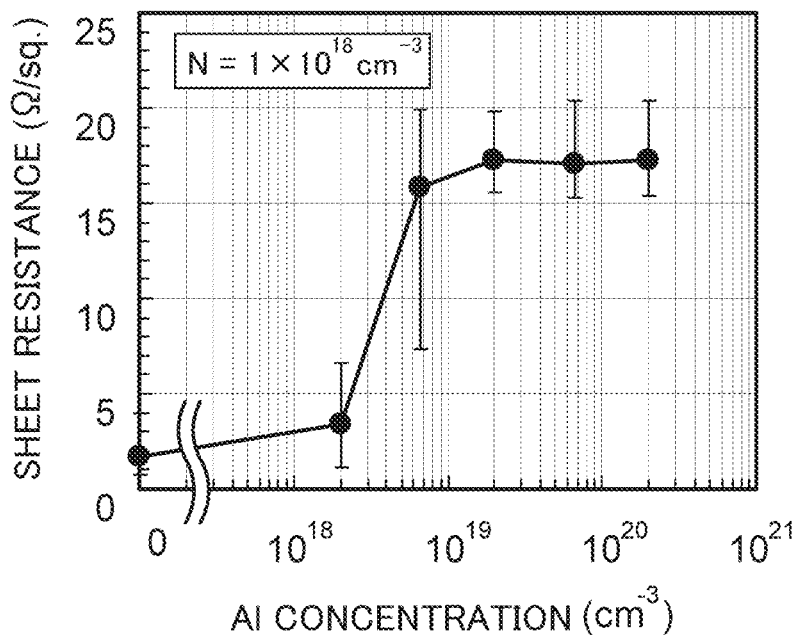
FIG. 9 is a graph illustrating the relationship between the aluminum concentration in the silicon carbide semiconductor layer before titanium silicidation and the sheet resistance of the titanium silicide layer.

FIG. 9 illustrates the relationship between the p-type impurity concentration in a silicon carbide semiconductor layer on which a metal silicide layer made of titanium silicide had not been formed yet and the sheet resistance of the metal silicide layer. The p-type impurity was aluminum, and the nitrogen concentration in the silicon carbide semiconductor layer on which the titanium silicide layer had not been formed yet was $1 \times 10^{18}$ cm$^{-3}$. FIG. 9 illustrates six results obtained by measuring the sheet resistance of the metal silicide layer when the aluminum concentration in the silicon carbide semiconductor layer on which the titanium silicide layer had not been formed yet was zero, when the aluminum concentration in the silicon carbide semiconductor layer on which the titanium silicide layer had not been formed yet was $2.0 \times 10^{18}$ cm$^{-3}$, when the aluminum concentration in the silicon carbide semiconductor layer on which the titanium silicide layer had not been formed yet was $6.7 \times 10^{18}$ cm$^{-3}$, when the aluminum concentration in the silicon carbide semiconductor layer on which the titanium silicide layer had not been formed yet was $2.0 \times 10^{19}$ cm$^{-3}$, when the aluminum concentration in the silicon carbide semiconductor layer on which the titanium silicide layer had not been formed yet was $6.7 \times 10^{19}$ cm$^{-3}$, and when the aluminum concentration in the silicon carbide semiconductor layer on which the titanium silicide layer had not been formed yet was $2.0 \times 10^{20}$ cm$^{-3}$. The aluminum concentration and the nitrogen concentration in FIG. 9 are calculated values determined based on the amount of aluminum implanted and the amount of nitrogen implanted, respectively. In the case of titanium silicide, similarly to the case of nickel silicide, when the aluminum concentration in the silicon carbide semiconductor layer on which the metal silicide layer had not been formed yet is equal to or lower than $2.0 \times 10^{18}$ cm$^{-3}$, the sheet resistance of the metal silicide layer is lower.

Figure 10:
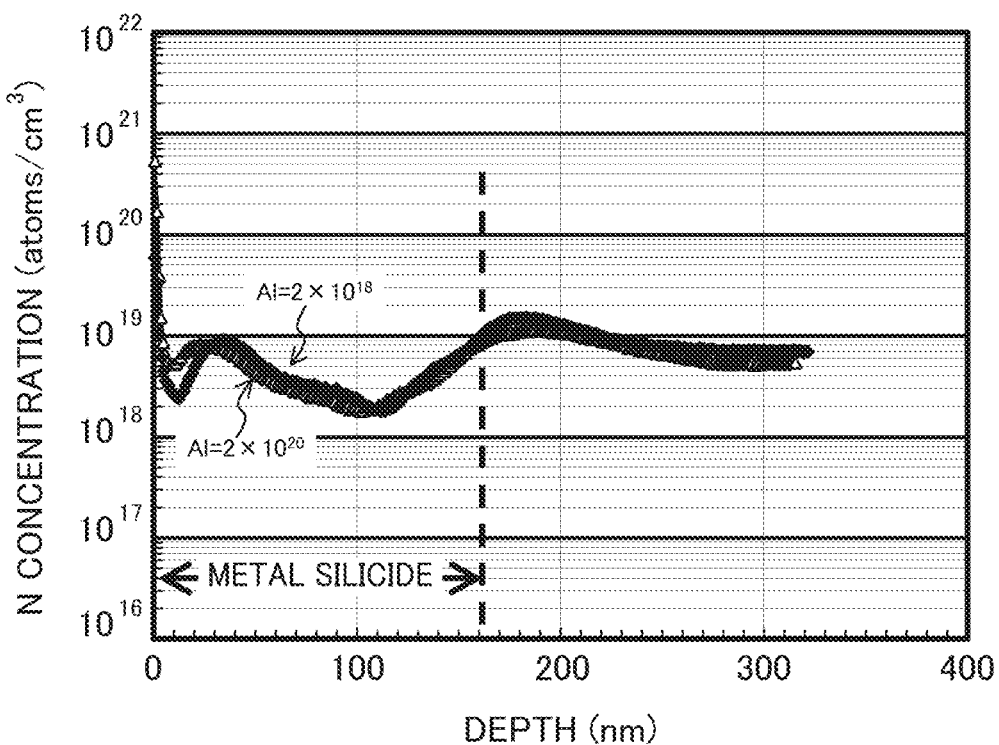
FIG. 10 is a graph illustrating the distribution of nitrogen in the nickel silicide layer.

FIG. 10 illustrates the nitrogen concentration in each of metal silicide layers made of nickel silicide, which was determined when silicon carbide semiconductor layers on each of which the metal silicide layer had not been formed yet had different aluminum concentrations. In FIG. 10, the nitrogen concentration in the silicon carbide semiconductor layer on which the metal silicide layer had not been formed yet was $1 \times 10^{18}$ cm$^{-3}$. A measurement was performed on a sample including a silicon carbide semiconductor layer having an aluminum concentration of $2 \times 10^{18}$ cm$^{-3}$ before the formation of a metal silicide layer on the silicon carbide semiconductor layer and a sample including a silicon carbide semiconductor layer having an aluminum concentration of $2 \times 10^{20}$ cm$^{-3}$ before the formation of a metal silicide layer on the silicon carbide semiconductor layer. Even if the silicon carbide semiconductor layers on each of which the metal silicide layer had not been formed yet had different aluminum concentrations, the silicon carbide semiconductor layers on each of which the metal silicide layer had been formed had substantially the same nitrogen concentration profile.

Figure 11:
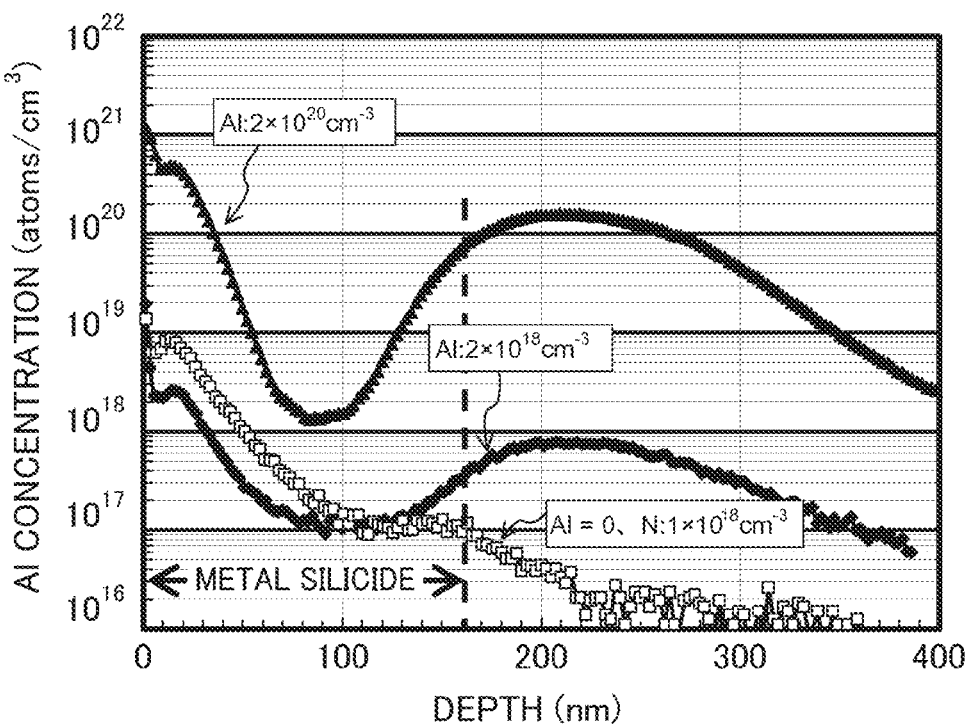
FIG. 11 is a graph illustrating the distribution of aluminum in the nickel silicide layer.

FIG. 11 illustrates the aluminum (Al) concentration in each of metal silicide layers made of nickel silicide, which was determined by SIMS (SIMS4500 made by AMETEK Co., Ltd). Dioxygen ($O_2$) ions were used as primary ions for SIMS analysis, and the primary ion acceleration voltage was 2 kV. The SIMS analysis was performed on a sample into which aluminum ions were not implanted, a sample including a silicon carbide semiconductor layer having an aluminum concentration of $2 \times 10^{18}$ cm$^{-3}$ before the formation of a metal silicide layer on the silicon carbide semiconductor layer, and a sample including a silicon carbide semiconductor layer having an aluminum concentration of $2 \times 10^{20}$ cm$^{-3}$ before the formation of a metal silicide layer on the silicon carbide semiconductor layer. The nitrogen concentration in the silicon carbide semiconductor layer of each sample on which the metal silicide layer had not been formed yet was $1 \times 10^{18}$ cm$^{-3}$. Even when aluminum is not intentionally introduced into the silicon carbide semiconductor layer, aluminum was detected in the metal silicide layer. The reason for this is that aluminum contained in the substrate was deposited. The aluminum concentration significantly increases in the vicinity of the surface of the metal silicide layer, and is highest at the surface. The aluminum concentration in a portion of the metal silicide layer except the outermost surface thereof varies from a minimum value to about 10 through 100 times the minimum value. This shows that aluminum is more significantly segregated than nitrogen the concentration of which therein varies from a minimum value to about several through 10 times the minimum value.

Figure 12:
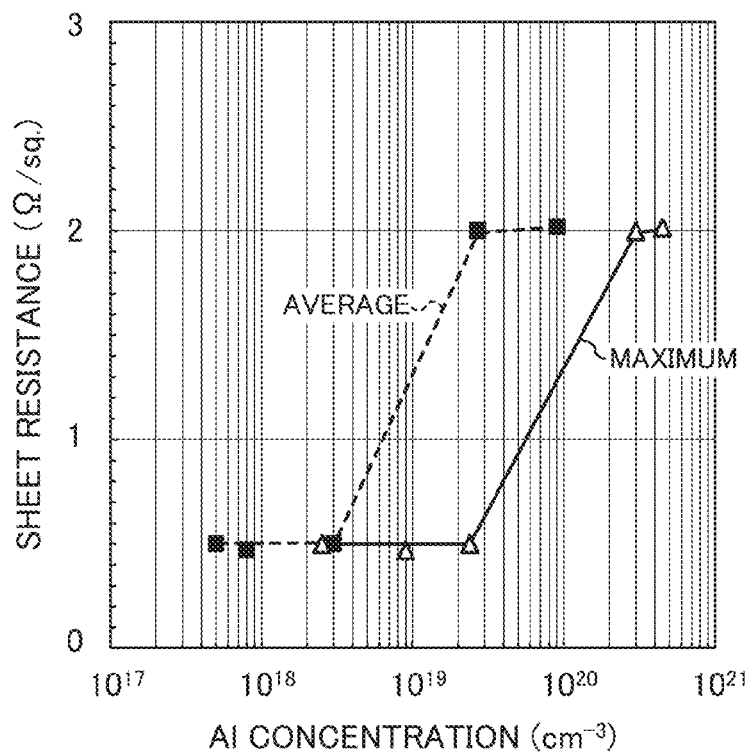
FIG. 12 is a graph illustrating the relationship between the aluminum concentration in the nickel silicide layer and the sheet resistance of the nickel silicide layer.

FIG. 12 illustrates the relationship between the aluminum concentration in a metal silicide layer made of nickel silicide, which was measured by SIMS, and the sheet resistance of the metal silicide layer. FIG. 12 illustrates five results obtained by measuring the sheet resistance of the metal silicide layer when the average aluminum concentration in the metal silicide layer was $5.1 \times 10^{17}$ cm$^{-3}$, when the average aluminum concentration in the metal silicide layer was $7.5 \times 10^{17}$ cm$^{-3}$, when the average aluminum concentration in the metal silicide layer was $3.0 \times 10^{18}$ cm$^{-3}$, when the average aluminum concentration in the metal silicide layer was $2.7 \times 10^{19}$ cm$^{-3}$, and when the aluminum concentration in the metal silicide layer was $9.0 \times 10^{19}$ cm$^{-3}$. FIG. 12 further illustrates five results obtained by measuring the sheet resistance of the metal silicide layer when the maximum aluminum concentration in the metal silicide layer was $2.6 \times 10^{18}$ cm$^{-3}$, when the maximum aluminum concentration in the metal silicide layer was $8.6 \times 10^{18}$ cm$^{-3}$, when the maximum aluminum concentration in the metal silicide layer was $2.4 \times 10^{19}$ cm$^{-3}$, when the maximum aluminum concentration in the metal silicide layer was $3.0 \times 10^{20}$ cm$^{-3}$, and when the maximum aluminum concentration in the metal silicide layer was $4.8 \times 10^{20}$ cm$^{-3}$. When the average aluminum concentration in the metal silicide layer is equal to or lower than $3.0 \times 10^{18}$ cm$^{-3}$, or when the maximum aluminum concentration in the metal silicide layer is equal to or lower than $2.4 \times 10^{19}$ cm$^{-3}$, the sheet resistance of the metal silicide layer is lower. Note that the average aluminum concentration and the maximum aluminum concentration respectively correspond to the average aluminum concentration and the maximum aluminum concentration in a portion of the metal silicide layer except a portion thereof within 50 nm from the interface between the metal silicide layer and the underlying layer. Note that the average nitrogen concentration was calculated by integrating the concentration multiplied by the depth from the point of measurement of the concentration to the next point of measurement over a predetermined region of the metal silicide layer (the portion of the metal silicide layer except the portion thereof within 50 nm from the interface between the metal silicide layer and the underlying layer) in a SIMS depth profile and dividing the resultant value by the thickness of the predetermined region.

For the reasons described above, the reason why, when the aluminum concentration in the silicon carbide semiconductor layer on which the metal silicide layer had not been formed yet is high, the sheet resistance of the metal silicide layer is high is not that the presence of aluminum affects the nitrogen concentration profile, and is that aluminum itself affects the sheet resistance of the metal silicide layer.

Since the silicon carbide semiconductor layer has a wide band gap, the p-type impurity concentration in the silicon carbide semiconductor layer is preferably high to reduce the contact resistance between the metal silicide layer and the silicon carbide semiconductor layer. However, what affects the contact resistance is the p-type impurity concentration in the vicinity of the interface between the metal silicide layer and the silicon carbide semiconductor layer. For this reason, if the aluminum concentration in the vicinity of the interface between a metal silicide layer and a silicon carbide semiconductor layer is high, and the aluminum concentration in the vicinity of the surface of the metal silicide layer is low, the contact resistance can be kept low, and the metal silicide layer can have a low sheet resistance.

The sheet resistance of an ohmic electrode is preferably low. Thus, the average nitrogen concentration in the metal silicide layer serving as an ohmic electrode may be, for example, higher than or equal to $6.9\times10^{18}$ cm$^{-3}$. The average nitrogen concentration in the metal silicide layer serving as the ohmic electrode may be, for example, equal to or lower than $1\times10^{21}$ cm$^{-3}$. The minimum nitrogen concentration in the metal silicide layer may be, for example, higher than or equal to $1.8\times10^{18}$ cm$^{-3}$. The minimum nitrogen concentration in the metal silicide layer may be, for example, equal to or lower than $1\times10^{21}$ cm$^{-3}$. The average aluminum concentration in a region of the metal silicide layer except a region thereof within 50 nm from the interface between the metal silicide layer and the underlying layer may be, for example, equal to or lower than $3.0\times10^{18}$ cm$^{-3}$, or may be, for example, equal to or lower than $7.5\times10^{17}$ cm$^{-3}$. The maximum aluminum concentration in the region of the metal silicide layer except the region thereof within 50 nm from the interface between the metal silicide layer and the underlying layer may be, for example, equal to or lower than $2.4\times10^{19}$ cm$^{-3}$, or may be, for example, equal to or lower than $8.6\times10^{18}$ cm$^{-3}$.

Since aluminum is significantly segregated, the silicon carbide semiconductor layer on which the metal silicide layer has not been formed yet and which has a high aluminum concentration has a high aluminum concentration in the vicinity of its surface, whereas the aluminum concentration in a portion of the silicon carbide semiconductor layer within the depth range from about several tens of nanometers to about 100 nm from the surface of the silicon carbide semiconductor layer is lower than that in the surface of the silicon carbide semiconductor layer. For this reason, after the metal silicide layer is formed, a portion of the metal silicide layer located in the vicinity of the surface thereof and having a high aluminum concentration is removed to expose a portion thereof having an aluminum concentration that is equal to or lower than a predetermined concentration, thereby reducing the sheet resistance of the metal silicide layer.

Figure 13:
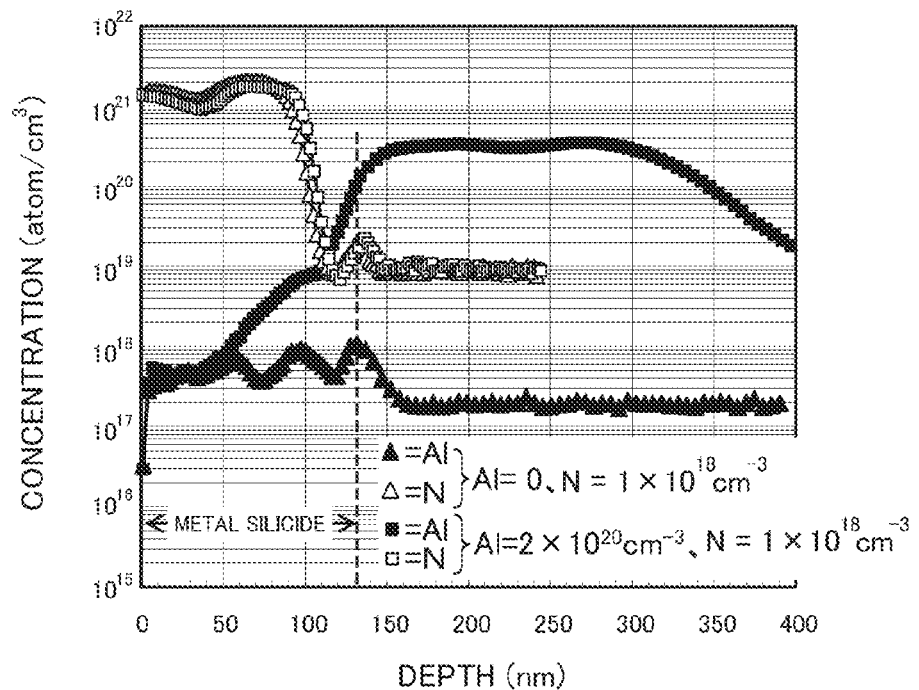
FIG. 13 is a graph illustrating the distribution of each of aluminum and nitrogen in the titanium silicide layer.

FIG. 13 illustrates the aluminum concentration and the nitrogen concentration in each of titanium silicide layers, which were determined in a manner similar to that in which the aluminum concentration and the nitrogen concentration in each nickel silicide layer were determined. In FIG. 13, the aluminum concentration and the nitrogen concentration in a sample into which aluminum ions were not implanted are plotted with black triangles and white triangles, respectively. The aluminum concentration and the nitrogen concentration in a sample including a silicon carbide semiconductor layer having an aluminum concentration of $2\times10^{20}$ cm$^{-3}$ before the formation of the metal silicide layer on the silicon carbide semiconductor layer are plotted with black squares and white squares, respectively.

The nitrogen concentration in the silicon carbide semiconductor layer of each sample before silicidation was $1\times10^{18}$ cm$^{-3}$. When the metal silicide layer is made of titanium silicide, the nitrogen concentration in the metal silicide layer is higher than that in the silicon carbide semiconductor layer. However, a portion of the metal silicide layer and a portion of the silicon carbide semiconductor layer except a portion of each of the metal silicide layer and the silicon carbide semiconductor layer in the vicinity of the interface between the metal silicide layer and the silicon carbide semiconductor layer have substantially the same nitrogen concentration, and the aluminum concentration hardly affects the nitrogen concentration profile.

When the metal silicide layer is made of titanium silicide, a significant increase in aluminum concentration in the vicinity of the surface of the metal silicide layer, which was observed when the metal silicide layer is made of nickel silicide, was not observed. However, in the sample having an aluminum concentration of $2\times10^{20}$ cm$^{-3}$, a considerable amount of aluminum exists in the metal silicide layer above the interface between the metal silicide layer and the silicon carbide semiconductor layer similarly to when the metal silicide layer is made of nickel silicide. Specifically, the average aluminum concentration in the titanium silicide layer of the sample into which aluminum ions were not implanted was $5.6\times10^{17}$ cm$^{-3}$, and the maximum aluminum concentration therein was $1.1\times10^{18}$ cm$^{-3}$.

The average aluminum concentration in the titanium silicide layer of the sample including the silicon carbide semiconductor layer having an aluminum concentration of $2\times10^{20}$ cm$^{-3}$ before the formation of the metal silicide layer on the silicon carbide semiconductor layer was $1.4\times10^{19}$ cm$^{-3}$, and the maximum aluminum concentration therein was $1.7\times10^{20}$ cm$^{-3}$.

The average aluminum concentration and the maximum aluminum concentration respectively correspond to the average aluminum concentration and the maximum aluminum concentration in a portion of the metal silicide layer except a portion thereof within 50 nm from the interface between the metal silicide layer and the underlying layer. Note that the average aluminum concentration was calculated by integrating the concentration multiplied by the depth from the point of measurement to the next point of measurement over a predetermined region of the metal silicide layer (the portion of the metal silicide layer except the portion thereof within 50 nm from the interface between the metal silicide layer and the underlying layer) in a SIMS depth profile and dividing the resultant value by the thickness of the predetermined region.

When the metal silicide layer is made of titanium silicide, the metal silicide layer having an average aluminum concentration of $5.6\times10^{17}$ cm$^{-3}$ and a maximum aluminum concentration of $1.1\times10^{18}$ cm$^{-3}$ had a sheet resistance of about 1 $\Omega$/sq. In contrast, the metal silicide layer having an average aluminum concentration of $1.4\times10^{19}$ cm$^{-3}$ and a maximum aluminum concentration of $1.7\times10^{20}$ cm$^{-3}$ had a sheet resistance of about 12 $\Omega$/sq.

As such, when the metal silicide layer is made of titanium silicide, the p-type impurity concentration in the metal silicide layer and the p-type impurity concentration profile affect the sheet resistance similarly to when the metal silicide layer is made of nickel silicide.

In view of the above finding, a semiconductor device of this embodiment and a method for fabricating the same have aspects described below.

An example semiconductor device according to this embodiment includes: a first silicon carbide semiconductor layer; a p-type first impurity region provided in the first silicon carbide semiconductor layer; and a first ohmic electrode forming ohmic contact with the p-type first impurity region. The first ohmic electrode is a silicon alloy containing nitrogen, an average concentration of nitrogen in the first ohmic electrode is higher than or equal to one half of an average concentration of nitrogen in the first impurity region, and an average concentration of a p-type impurity in a portion of the first ohmic electrode except a portion of the first ohmic electrode within 50 nm from an interface between the first ohmic electrode and the first impurity region is equal to or lower than $3.0\times10^{18}$ cm$^{-3}$.

In the example semiconductor device, the average concentration of nitrogen in the first ohmic electrode may be higher than or equal to $6.9\times10^{18}$ cm$^{-3}$.

In the example semiconductor device, a concentration of the p-type impurity in a surface of the first ohmic electrode may be lower than that of the p-type impurity at the interface between the first ohmic electrode and the first impurity region.

In the example semiconductor device, the p-type impurity may be aluminum.

In the example semiconductor device, a maximum concentration of the p-type impurity in the portion of the first ohmic electrode except the portion of the first ohmic electrode within 50 nm from the interface between the first ohmic electrode and the first impurity region is equal to or lower than $2.4\times10^{19}$ cm$^{-3}$.

The example semiconductor device may further include: a second silicon carbide semiconductor layer located on a portion of the first silicon carbide semiconductor layer except a portion of the first silicon carbide semiconductor layer on which the first ohmic electrode is formed. The second silicon carbide semiconductor layer may contain nitrogen.

In the example semiconductor device, a portion of the second silicon carbide semiconductor layer may function as a channel.

The example semiconductor device may further include: an n-type second impurity region adjacent to the first impurity region; a p-type third impurity region adjacent to the first and second impurity regions; a gate electrode provided on the third impurity region with a gate insulating film interposed between the gate electrode and the third impurity region; and a second ohmic electrode opposite to the first ohmic electrode with respect to the first silicon carbide semiconductor layer.

In the example semiconductor device, the first ohmic electrode may be a nickel-silicon alloy containing nitrogen.

In the example semiconductor device, the first ohmic electrode may be a titanium-silicon alloy containing nitrogen.

An example method for fabricating a semiconductor device according to this embodiment includes: preparing a first silicon carbide semiconductor layer; forming a p-type first impurity region by selectively introducing a p-type impurity into an upper portion of the first silicon carbide semiconductor layer; forming an n-type region containing nitrogen on the first impurity region; forming an ohmic electrode forming ohmic contact with the first impurity region by alloying the n-type region on which metal has been deposited by annealing. In the forming of the ohmic electrode, the n-type region is alloyed to the interface between the n-type region and the first impurity region. Alternatively, the n-type region and a portion of the first impurity region are alloyed.

In the example method, in the forming of the n-type region, nitrogen may be introduced into an upper portion of the first impurity region, or a second silicon carbide semiconductor layer containing nitrogen may be formed on the first impurity region.

In the example method, when metal is to be deposited on the n-type region, the concentration of the p-type impurity in a surface of the n-type region may be equal to or lower than $2\times10^{18}$ cm$^{-3}$, and the concentration of nitrogen therein may be higher than or equal to $1\times10^{18}$ cm$^{-3}$.

In the example method, in the selectively introducing of the p-type impurity, the p-type impurity may be introduced into the first impurity region such that the concentration of the p-type impurity in the upper portion of the first impurity region is lower than that of the p-type impurity in a lower portion thereof.

In the example method, in the selectively introducing of the p-type impurity, the p-type impurity may be introduced into the first impurity region such that the concentration profile of the p-type impurity in the first impurity region corresponds to a box profile.

The example method may further include: etching a surface of the ohmic electrode.

(Embodiment)

A semiconductor device according to an embodiment is, for example, a power semiconductor device of silicon carbide (SiC), and is suitably used as a semiconductor device that withstands high voltage and high current and operates at high speed. An example configuration of the semiconductor device according to this embodiment will now be specifically described.

Figure 14:
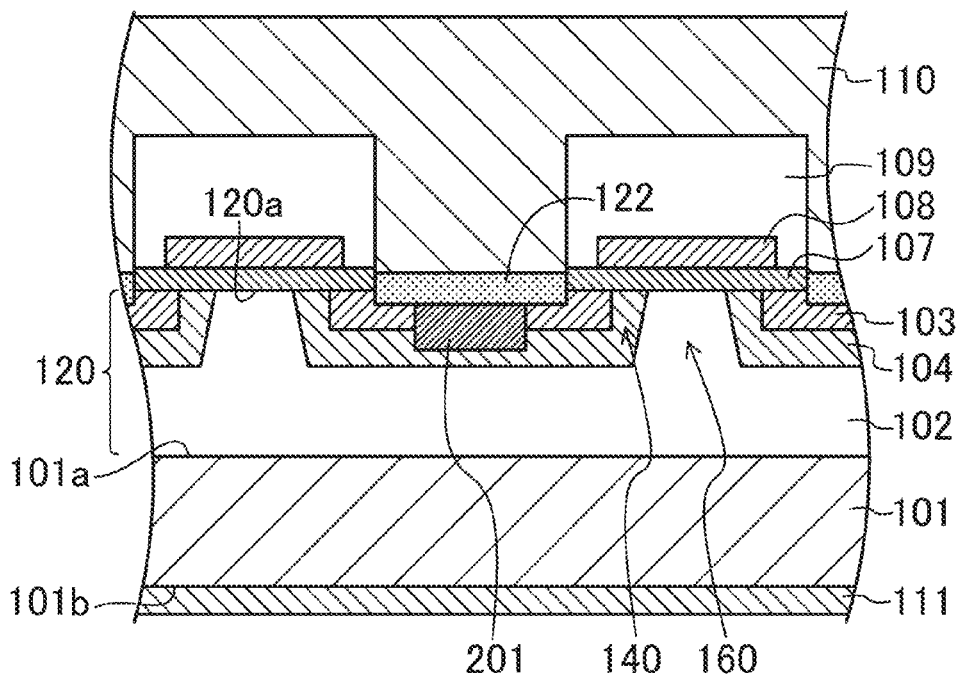
FIG. 14 is a cross-sectional view illustrating a semiconductor device according to an embodiment.

FIG. 14 is a cross-sectional view of the configuration of a semiconductor device 10 according to the embodiment. The semiconductor device 10 includes an n-type semiconductor substrate 101 having a principal surface 101*a* and a back surface 101*b* and containing silicon carbide. An n-type first silicon carbide semiconductor layer 120 having a lower impurity concentration than the semiconductor substrate 101 is provided on the principal surface 101*a* of the semiconductor substrate 101. A p-type first region 104 is selectively formed in the first silicon carbide semiconductor layer 120, and the first region 104 includes an n-type second region 103. The concentration of an n-type impurity in the second region 103 is higher than that in the semiconductor substrate 101. A region of the first silicon carbide semiconductor layer 120 except the first region 104 serves as a drift region 102. Thus, the concentration of the n-type impurity in the drift region 102 is lower than that in the semiconductor substrate 101. A portion of the drift region 102 between the first region 104 and an adjacent first region 104 is referred to as a JFET region 160.

The first region 104 is formed in a region of the first silicon carbide semiconductor layer 120 from an upper surface 120*a* thereof to a predetermined depth, and the second region 103 is formed in a region of the first region 104 from the upper surface 120*a* of the first silicon carbide semiconductor layer 120 to another predetermined depth. The bottom of the second region 103 is shallower than the bottom of the first region 104, and the second region 103 does not protrude beyond the first region 104. The first region 104 and the second region 103 are exposed at the upper surface 120*a* of the first silicon carbide semiconductor layer 120. The first region 104 has a p-type contact region 201. A first ohmic electrode 122 is provided on the contact region 201. The first ohmic electrode 122 forms ohmic contact with the contact region 201. When viewed in plan, the second region 103 surrounds the contact region 201. The contact region 201 protrudes beyond the second region 103, and contacts the first region 104. Thus, the first ohmic electrode 122 is electrically connected through the contact region 201 to the first region 104, and the potential of the first ohmic electrode 122 is substantially equal to that of the first region 104.

A gate insulating film 107 is provided directly on the JFET region 160 and a current path region 140 that is a portion of the first region 104 between the second region 103 and the JFET region 160, and a gate electrode 108 is provided on the gate insulating film 107. The current path region 140 that is a portion of the first region 104 between the second region 103 and the JFET region 160 functions as an inverted channel.

An interlayer insulating film 109 covers the upper surface 120*a* of the first silicon carbide semiconductor layer 120, and has a contact hole exposing the first ohmic electrode 122. The contact hole is filled with an interconnect 110, and the interconnect 110 contacts the first ohmic electrode 122, and is electrically connected to the first ohmic electrode 122. A second ohmic electrode 111 is provided on the back surface 101*b* of the semiconductor substrate 101. Although not shown, the gate electrode 108 includes contact holes and interconnects. In the semiconductor device of this embodiment, the first ohmic electrode 122 functions as a source electrode, and the second ohmic electrode 111 functions as a drain electrode.

A substrate made of hexagonal silicon carbide can be used as the semiconductor substrate 101. The thickness of the semiconductor substrate 101 can be, for example, greater than or equal to 250 μm and equal to or less than 350 μm, and the impurity concentration in the semiconductor substrate 101 can be, for example, $8 \times 10^{18}$ cm$^{-3}$ (n$^+$). When the semiconductor substrate 101 is determined to have a low impurity concentration, a substrate made of cubic silicon carbide can be also used as the semiconductor substrate 101.

The first silicon carbide semiconductor layer 120 can be a silicon carbide layer formed on the principal surface 101a of the semiconductor substrate 101 by epitaxial growth. The thickness of the first silicon carbide semiconductor layer 120 can be, for example, 4-15 μm, and the impurity concentration therein can be, for example, $5 \times 10^{15}$ cm$^{-3}$ (n$^-$). Another epitaxial layer (e.g., a silicon carbide semiconductor layer having an impurity concentration of $6 \times 10^{16}$ cm$^{-3}$) may be provided between the semiconductor substrate 101 and the first silicon carbide semiconductor layer 120.

The thickness of the first region 104 (the depth thereof from the upper surface 120a of the first silicon carbide semiconductor layer 120) can be, for example, greater than or equal to 0.5 μm and equal to or less than 1.0 μm. The impurity concentration in the first region 104 can be, for example, $1.5 \times 10^{18}$ cm$^{-3}$ (p$^-$). The thickness of the second region 103 (the depth thereof from the upper surface 120a of the first silicon carbide semiconductor layer 120) can be, for example, 0.25 μm, and the impurity concentration in the second region 103 can be, for example, $5 \times 10^{19}$ cm$^{-3}$ (n$^{++}$).

In this embodiment, the impurity concentration at the interface between the first ohmic electrode 122 and the contact region 201 can be, for example, $6 \times 10^{19}$ cm$^{-3}$ (p$^+$). The length (width) of the JFET region 160 can be, for example, 3 μm. The width (length) of the current path region 140 can be, for example, 0.5 μm.

The gate insulating film 107 can be made of, for example, silicon dioxide (SiO$_2$), and can have a thickness of, for example, 70 nm. The gate electrode 108 may be made of, for example, polysilicon (poly-Si), and can have a thickness of, for example, 500 nm. The first ohmic electrode 122 can be made of, for example, nickel silicide that is an alloy of nickel (Ni) and silicon (Si), and can have a thickness of, for example, 70 nm. The first ohmic electrode 122 may be made of another metal silicide, such as titanium silicide that is an alloy of titanium (Ti) and silicon (Si). The second ohmic electrode 111 can be also made of, for example, titanium silicide or nickel silicide, and can have a thickness of, for example, 100 nm. To facilitate soldering for housing the semiconductor device 10 in a plastic package, nickel (Ni) and silver (Ag) or nickel (Ni) and gold (Au) may be deposited on the second ohmic electrode 111.

In this embodiment, the aluminum concentration in the first ohmic electrode 122 is low, and the nitrogen concentration therein is high. This can reduce the sheet resistance of the first ohmic electrode 122 that is a metal silicide layer. Furthermore, the aluminum concentration at the interface between the first ohmic electrode 122 and the contact region 201 is high. This can reduce the contact resistance between the first ohmic electrode 122 and the contact region 201 to a low level. To reduce the contact resistance between the first ohmic electrode 122 and the contact region 201 to a low level, the aluminum concentration at the interface between the first ohmic electrode 122 and the contact region 201 is preferably higher than or equal to $3 \times 10^{19}$ cm$^{-3}$.

In the semiconductor device 10, control is performed on current passing through a current path from the second region 103 provided in the first region 104 through the JFET region 160 to the back surface 101b of the semiconductor substrate 101. Thus, the semiconductor device 10 includes the gate electrode 108 formed at least on the current path region 140, which is a portion of the first region 104 between the second region 103 and the JFET region 160, with the gate insulating film 107 interposed between the gate electrode 108 and the current path region 140. A voltage is applied between the first ohmic electrode 122 and the gate electrode 108 to enable the control of the current passing through the current path.

In the semiconductor device 10 of this embodiment, the contact resistance between the first ohmic electrode 122 and the contact region 201 is low, the sheet resistance of the first ohmic electrode 122 is low. For this reason, when a voltage is applied between the first ohmic electrode 122 and the gate electrode 108, the potential of the current path region 140 that is a portion of the first region 104 can rapidly match that of the first ohmic electrode 122. This enables the operation of the semiconductor device 10 without delay from switching performed by applying the voltage between the first ohmic electrode 122 and the gate electrodes 108.

Any semiconductor device in which current is controlled by applying the voltage between the first ohmic electrode 122 and the gate electrode 108 can obtain similar advantages. While FIG. 14 illustrates the semiconductor device including the inverted channel, the semiconductor device of this embodiment may be a semiconductor device including a channel layer functioning as an accumulation channel between a first region 104 and a gate insulating film 107.

Next, a method for fabricating the semiconductor device 10 of this embodiment will be described with reference to FIGS. 15(a)-19. FIGS. 15(a)-19 illustrate process steps in the method for fabricating the semiconductor device of this embodiment.

First, to obtain the structure illustrated in FIG. 15(a), the following process steps are performed. An n-type 4H—SiC (0001) substrate is prepared as a semiconductor substrate 101. A substrate that is offcut 8° or 4° in a <11-20> direction can be used as the substrate. The concentration of an n-type impurity in the substrate can be higher than or equal to $1 \times 10^{18}$ cm$^{-3}$ and equal to or lower than $5 \times 10^{19}$ cm$^{-3}$.

Next, a first silicon carbide semiconductor layer 120 is formed on the principal surface 101a of the semiconductor substrate 101 by, for example, epitaxial growth. The first silicon carbide semiconductor layer 120 can be formed by thermal chemical vapor deposition (CVD) using, for example, silane (SiH$_4$) and propane (C$_3$H$_8$) as a source gas, hydrogen (H$_2$) as a carrier gas, and nitrogen (N$_2$) as a dopant gas. The thickness of the first silicon carbide semiconductor layer 120 can be greater than or equal to 10 μm, and the impurity concentration in the first silicon carbide semiconductor layer 120 can be higher than or equal to $1 \times 10^{15}$ cm$^{-3}$ and equal to or lower than $1 \times 10^{16}$ cm$^{-3}$.

Next, an implantation mask material is deposited on an upper surface 120a of the first silicon carbide semiconductor layer 120 (not shown), and a photoresist (not shown) is formed on the deposited implantation mask material. The implantation mask material can be, for example, silicon oxide. The implantation mask material of silicon oxide can be deposited by plasma CVD at a power of 200 W using, for example, a silane (SiH$_4$) gas and a dinitrogen monoxide (N$_2$O) gas. The thickness of the implantation mask material can be greater than or equal to 0.5 μm and equal to or less than 1.0 μm. The location and size of the photoresist define a first region 104 and a JFET region 160. For example, a photosensitive organic film can be used as the photoresist, and the photoresist can be formed by typical photolithography. The thickness of the photoresist can be greater than or equal to 1.5 μm and equal to or less than 2.0 μm. The implantation mask material is anisotropically etched using the photoresist as a mask to form an implantation mask feature 172, and the photoresist is then removed. The implantation mask material can be etched by anisotropic dry etching using, for example, a $CF_4$ gas and a $CHF_3$ gas. The photoresist can be removed by, for example, oxygen plasma ashing. Unless specifically described below, an implantation mask for ion implantation can be formed in a similar manner.

Figure 15:
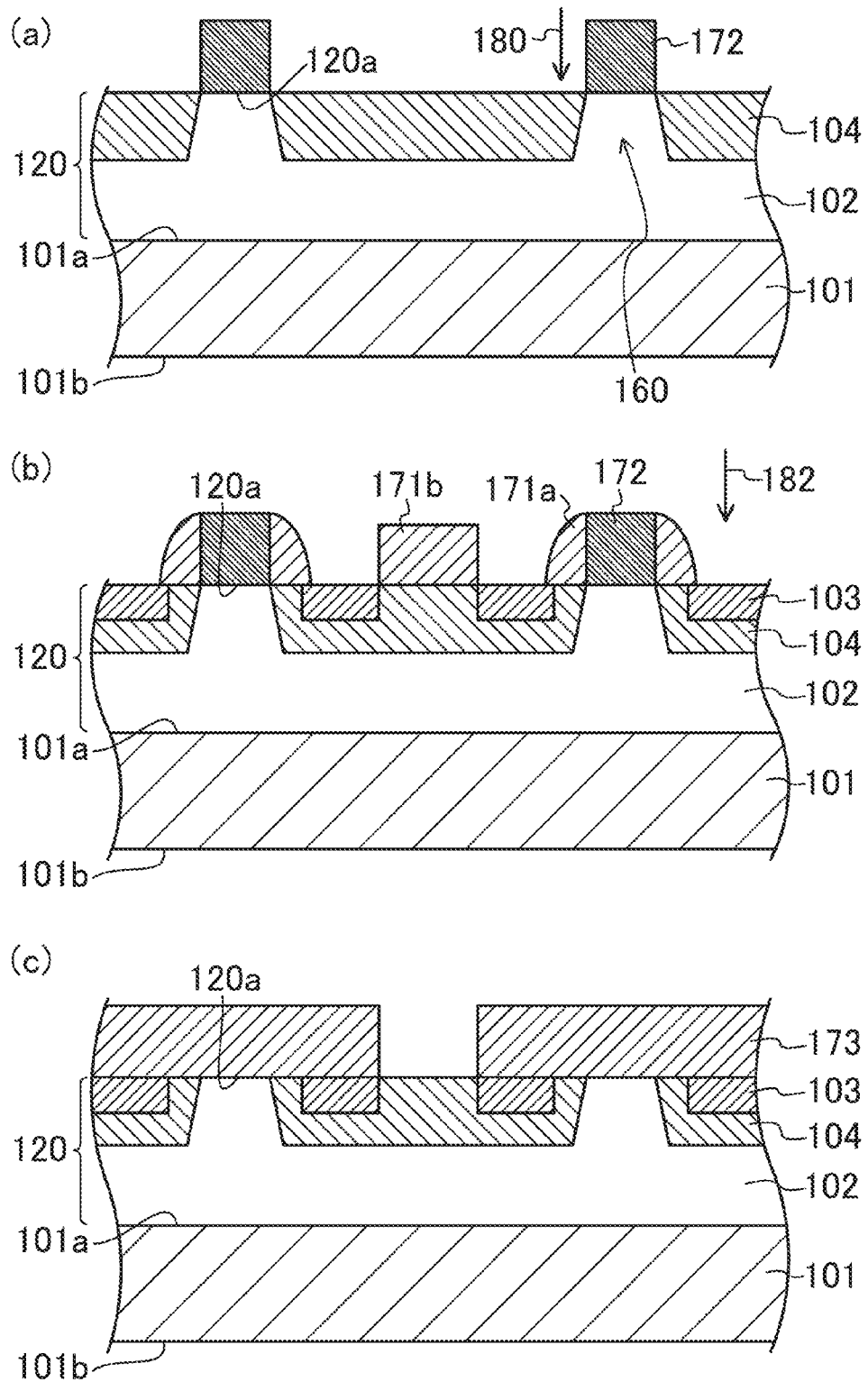
FIGS. 15(a)-15(c) are cross-sectional views illustrating process steps in a method for fabricating a semiconductor device according to the embodiment.

Next, as illustrated in FIG. 15(*a*), aluminum ions ($Al^+$) 180 being a p-type impurity are implanted into the first silicon carbide semiconductor layer 120 (as indicated by the arrow) using the implantation mask feature 172 as a mask, and the first region 104 having a predetermined depth is formed in the vicinity of the upper surface 120*a* of the first silicon carbide semiconductor layer 120. The ion implantation can be performed, for example, a plurality of times at different energies within the range of 30-350 keV while the temperature of the semiconductor substrate 101 including the first silicon carbide semiconductor layer 120 is kept at 500° C. The depth of the first region 104 can be, for example, greater than or equal to 0.5 μm and equal to or less than 1.0 μm. A region of the first silicon carbide semiconductor layer 120 defined between the first region 104 and an adjacent first region 104 and located in the vicinity of the upper surface 120*a* of the first silicon carbide semiconductor layer 120 corresponds to the JFET region 160. In this embodiment, the width of the JFET region 160 can be, for example, 3 μm. The other region of the first silicon carbide semiconductor layer 120 that does not include the first region 104 serves as a drift region 102.

Next, as illustrated in FIG. 15(*b*), an implantation mask material is deposited on the upper surface 120*a* of the first silicon carbide semiconductor layer 120 to cover the implantation mask feature 172. The implantation mask material is, for example, polysilicon (poly-Si), and can be formed by thermal CVD using $SiH_4$ as a source gas. A photoresist (not shown) having a predetermined pattern is formed on the implantation mask material, and the implantation mask material is then anisotropically etched to form implantation mask features 171*a* and 171*b*. The implantation mask feature 171*b* illustrated in the figure is under the photoresist, and is provided to prevent an impurity from being introduced into a region of the first silicon carbide semiconductor layer 120 in which a contact region 201 is to be formed. The implantation mask feature 171*a* is a sidewall of the implantation mask feature 172, and defines the width (length) of a channel. For example, a mixture of gases, such as chlorine ($Cl_2$), oxygen ($O_2$), and hydrogen bromide (HBr), can be used for anisotropic etching.

Subsequently, nitrogen ions ($N^+$) or phosphorus ions ($P^+$) 182 are implanted toward the upper surface 120*a* of the first silicon carbide semiconductor layer 120 (as indicated by the arrow) using the implantation mask features 172, 171*a*, and 171*b* as masks, thereby forming a second region 103. The ion implantation can be performed, for example, a plurality of times at different energies within the range of 30-90 keV while the temperature of the semiconductor substrate 101 is kept at 500° C. The depth of the second region 103 can be, for example, 0.25 μm.

Next, as illustrated in FIG. 15(*c*), the implantation mask features 171*a*, 171*b*, and 172 are removed, and an implantation mask feature 173 is then formed. When the implantation mask features 171*a* and 171*b* are oxide films, they can be removed with an aqueous hydrofluoric acid (HF) solution. When the implantation mask feature 172 is made of polysilicon, it can be removed with an aqueous mixture of hydrofluoric acid (HF), nitric acid ($HNO_3$), and hydrogen peroxide ($H_2O$).

Figure 16:
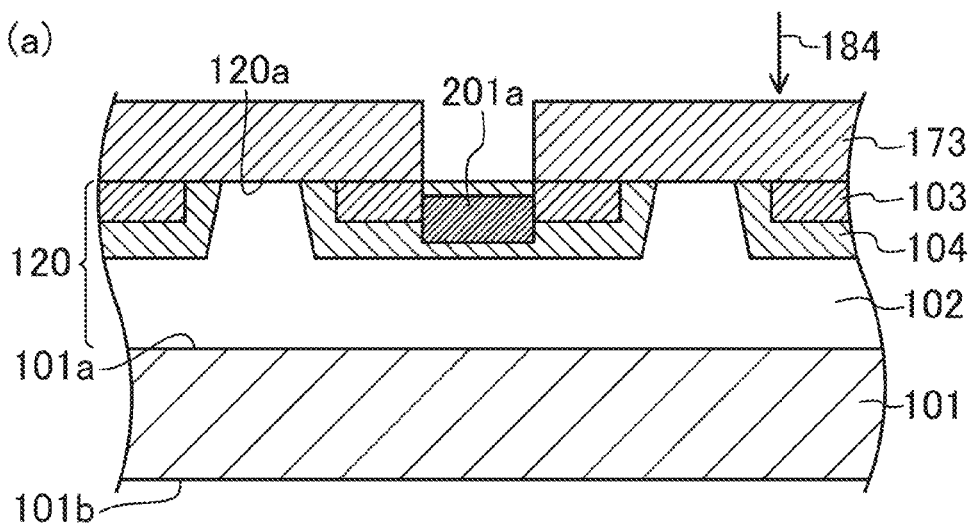
FIGS. 16(a)-16(c) are cross-sectional views illustrating other process steps in the method for fabricating a semiconductor device according to the embodiment.
Figure 16:
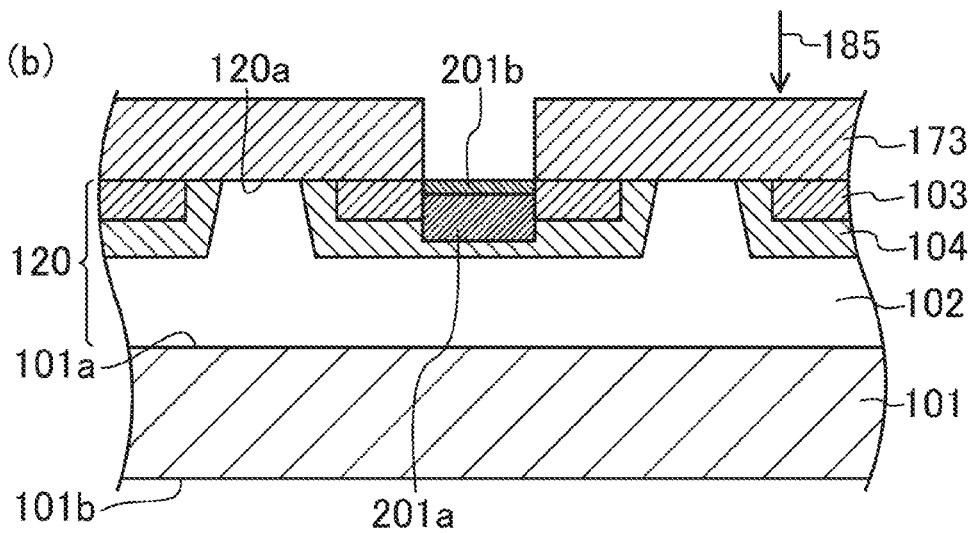
Figure 16:
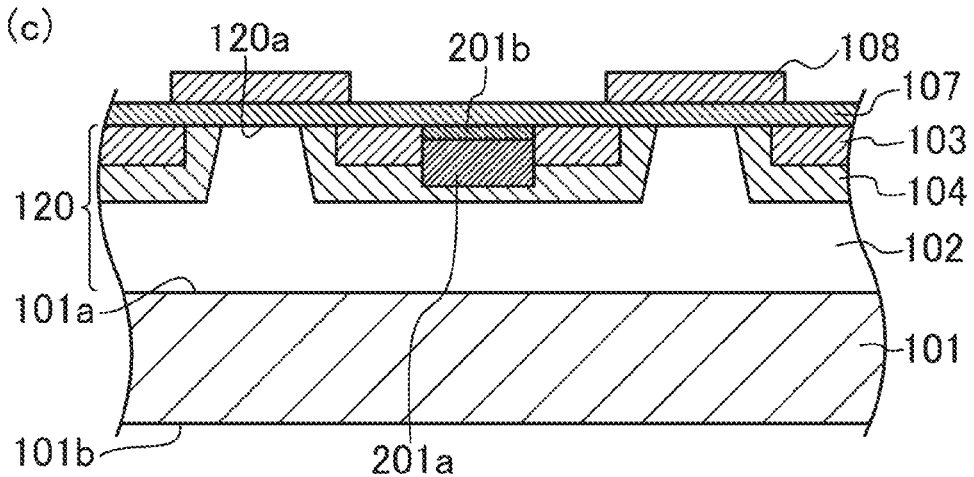
Figure 17:
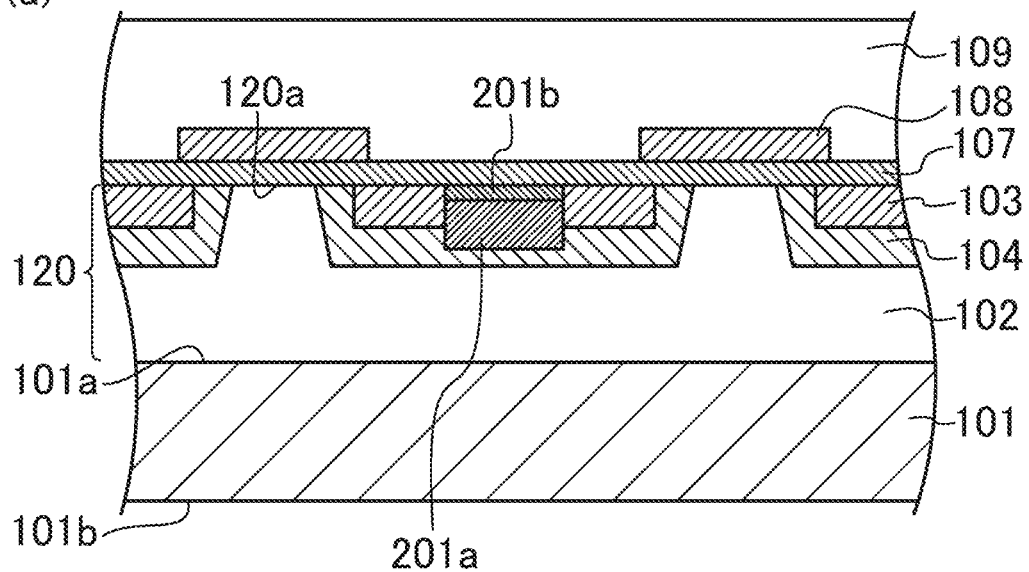
FIGS. 17(a) and 17(b) are cross-sectional views illustrating still other process steps in the method for fabricating a semiconductor device according to the embodiment.
Figure 17:
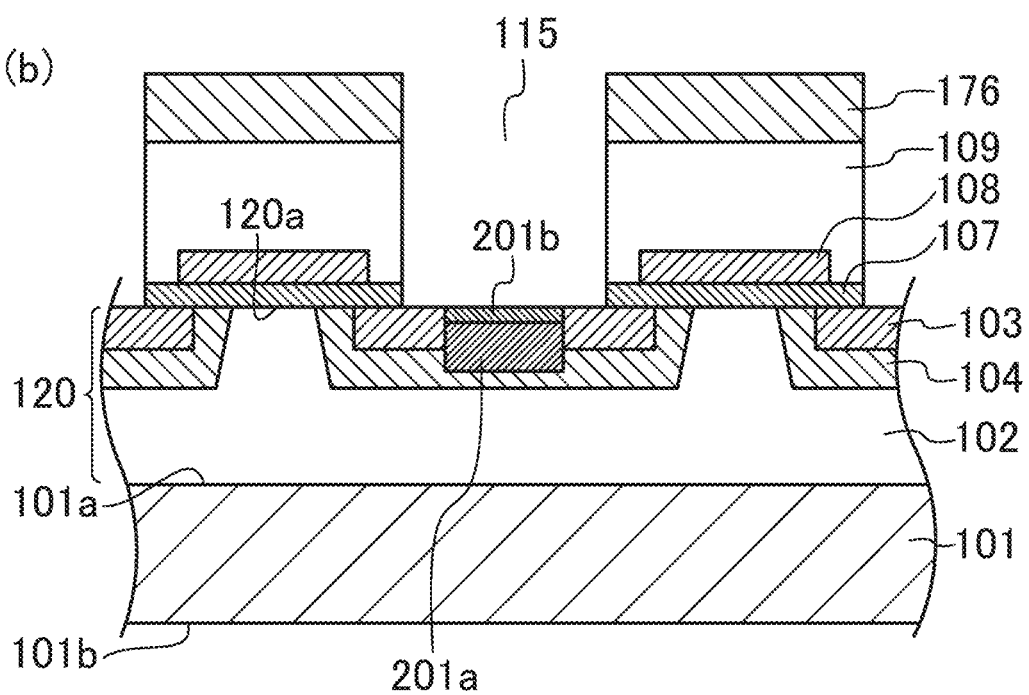
Figure 18:
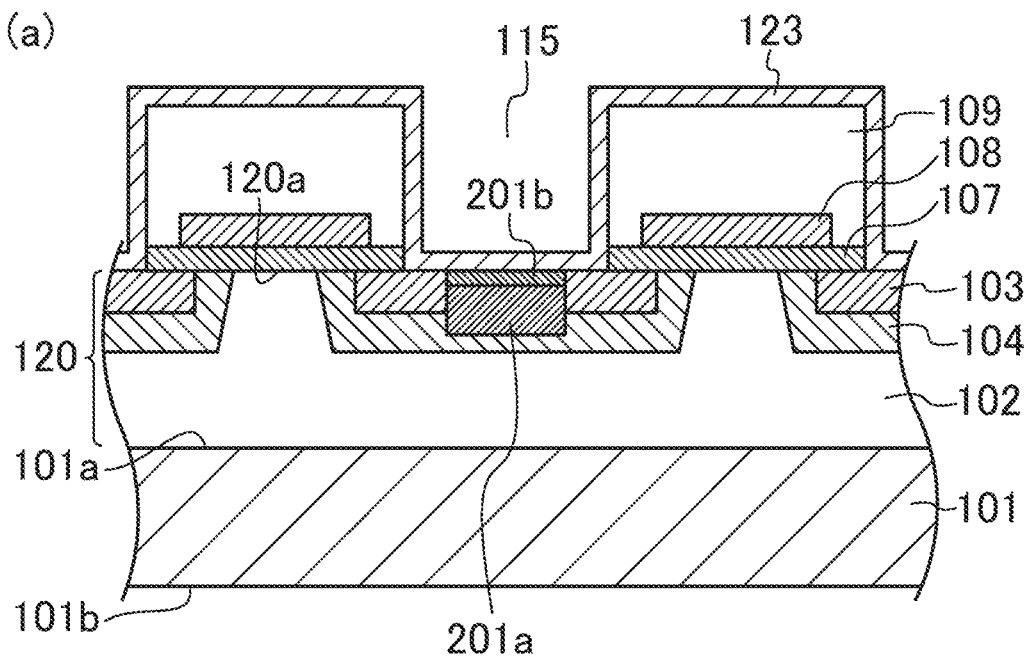
FIGS. 18(a) and 18(b) are cross-sectional views illustrating yet other process steps in the method for fabricating a semiconductor device according to the embodiment.
Figure 18:
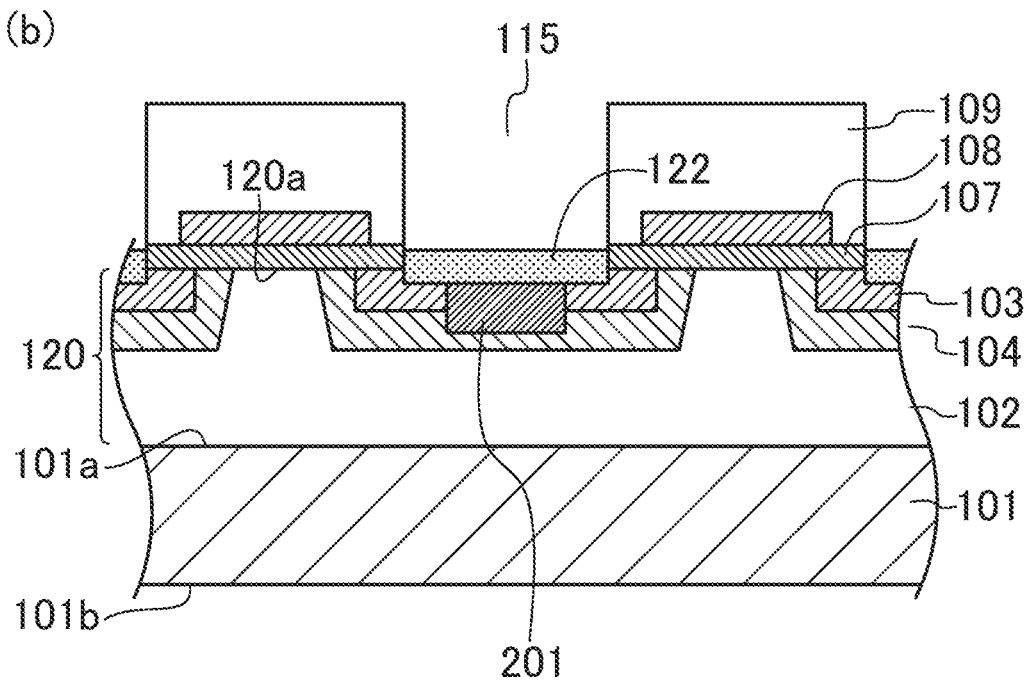

Next, as illustrated in FIG. 16(*a*), aluminum ions ($Al^+$) 184 are implanted into the first region 104 (as indicated by the arrow) using the implantation mask feature 173 as a mask, thereby forming a p-type region 201*a* that will be a portion of a contact region 201 that is deep from the upper surface 120*a* of the first silicon carbide semiconductor layer 120. To form the p-type regions 201*a*, the ions can be implanted into the first silicon carbide semiconductor layer 120 at an energy of 150 keV while the temperature of the semiconductor substrate 101 is kept at 500° C. The dose of the ions for this ion implantation can be $3 \times 10^{15}$ $cm^{-2}$.

When the ion implantation energy is greater than or equal to 150 keV, a high concentration of aluminum is hardly introduced into a region near the surface of the first silicon carbide semiconductor layer 120. For this reason, the aluminum concentration in the surface of the first silicon carbide semiconductor layer 120 can be equal to or lower than $2 \times 10^{18}$ $cm^{-3}$, and the aluminum concentration at a depth corresponding to the interface between the contact region 201 and a first ohmic electrode 122 that will be formed later can be higher than or equal to $1 \times 10^{20}$ $cm^{-3}$.

Next, as illustrated in FIG. 16(*b*), nitrogen ions ($N^+$) 185 are implanted into the first region 104 (as indicated by the arrow) using the implantation mask feature 173 as a mask, thereby forming an n-type region 201*b*. The n-type region 201*b* can be formed by implanting the ions, for example, at an energy of 30 keV and a dose of $5 \times 10^{14}$ $cm^{-2}$. The conditions on which the ions are implanted thereinto to form the p-type region 201*a* and the n-type region 201*b* are not limited to the above-described conditions.

The depth of the p-type region 201*a* is preferably determined such that the p-type impurity concentration in a lower end portion of the first ohmic electrode 122 that will be formed later is highest. The first ohmic electrode 122 is formed by alloying (siliciding) a metal and silicon carbide. When a metal layer is formed on a silicon carbide layer, and the layers are annealed, a portion of the silicon carbide layer having substantially the same thickness as the metal layer is silicided.

The surface of the underlying silicon carbide layer to be silicided may shift backward by substantially the same thickness as that of the metal layer for silicidation. When the metal layer has a thickness of, for example, 80 nm, silicidation may cause the surface of the underlying silicon carbide layer to shift backward by about 80 nm. In this case, a resultant silicide layer has a thickness of about 160 nm.

Not only the silicidation step, but also high-temperature annealing before the silicidation step may eliminate Si from the surface of the silicon carbide layer. Furthermore, etching before the silicidation step may cause the surface of the silicon carbide layer to shift backward. The surface of the silicon carbide layer may shift backward by up to a depth of about 50 nm. Thus, the depth of the p-type region 201*a* is preferably greater than the maximum depth by which the surface of the silicon carbide layer may shift backward.

Next, after the implantation mask feature 173 has been removed, the semiconductor substrate 101 including the first silicon carbide semiconductor layer 120 having a plurality of impurity diffusion regions is activated by activation annealing at a temperature of higher than or equal to 1000° C. In this embodiment, the temperature at which the semiconductor substrate 101 is annealed is, for example, 1800° C.

Next, as illustrated in FIG. 16(c), a gate insulating film 107 made of silicon dioxide ($SiO_2$) is formed on the first silicon carbide semiconductor layer 120, and a gate electrode material made of polysilicon (Poly-Si) is subsequently formed on the gate insulating film 107. Thereafter, a photoresist (not shown) is formed on the gate electrode material, and the gate electrode material is etched to form a gate electrode 108. The photoresist is then removed. The material and thickness of the gate insulating film 107 and those of the gate electrode 108 may be appropriately selected.

Next, as illustrated in FIG. 17(a), an interlayer insulating film 109 is formed on the first silicon carbide semiconductor layer 120 to cover the gate electrode 108. The interlayer insulating film 109 can be made of, for example, silicon dioxide ($SiO_2$), and can have a thickness of, for example, 1000 nm.

Next, as illustrated in FIG. 17(b), the interlayer insulating film 109 is etched using a photoresist 176 as a mask to form a contact hole 115. The interlayer insulating film 109 can be etched by dry etching using, for example, a mixture of $CHF_3$ and $O_2$.

Next, as illustrated in FIG. 18(a), the photoresist 176 is removed, and nickel (Ni) is then deposited in at least the contact hole 115 in the form of a contact metal 123.

Next, as illustrated in FIG. 18(b), the contact metal 123 is annealed to silicide a portion of the contact metal 123 in the contact hole 115 and the contact region 201. Subsequently, unreacted portions of the contact metal 123 are removed, and a first ohmic electrode 122 is formed in the contact holes 115. The first ohmic electrode 122 contacts the second region 103 and the first region 104.

The p-type region 201a is below the surface of the first silicon carbide semiconductor layer 120, and the n-type region 201b is formed in the surface of the first silicon carbide semiconductor layer 120. For this reason, the aluminum concentration in the surface of the silicon carbide semiconductor layer to be silicided is equal to or lower than $2 \times 10^{18}$ cm$^{-3}$, and the nitrogen concentration therein is higher than or equal to $1 \times 10^{18}$ cm$^{-3}$. Thus, the average nitrogen concentration in the formed first ohmic electrode 122 is higher than or equal to $6.9 \times 10^{18}$ cm$^{-3}$, and the minimum nitrogen concentration therein is higher than or equal to $1.8 \times 10^{18}$ cm$^{-3}$. The average aluminum concentration in a region of the first ohmic electrode 122 except a region thereof within 50 nm from the interface between the first ohmic electrode 122 and the contact region 201 is equal to or lower than $3.0 \times 10^{18}$ cm$^{-3}$, and the maximum aluminum concentration therein is equal to or lower than $2.4 \times 10^{19}$ cm$^{-3}$. Furthermore, the aluminum concentration at the interface between the formed first ohmic electrode 122 and the contact region 201 is higher than or equal to $3 \times 10^{19}$ cm$^{-3}$.

Figure 19:
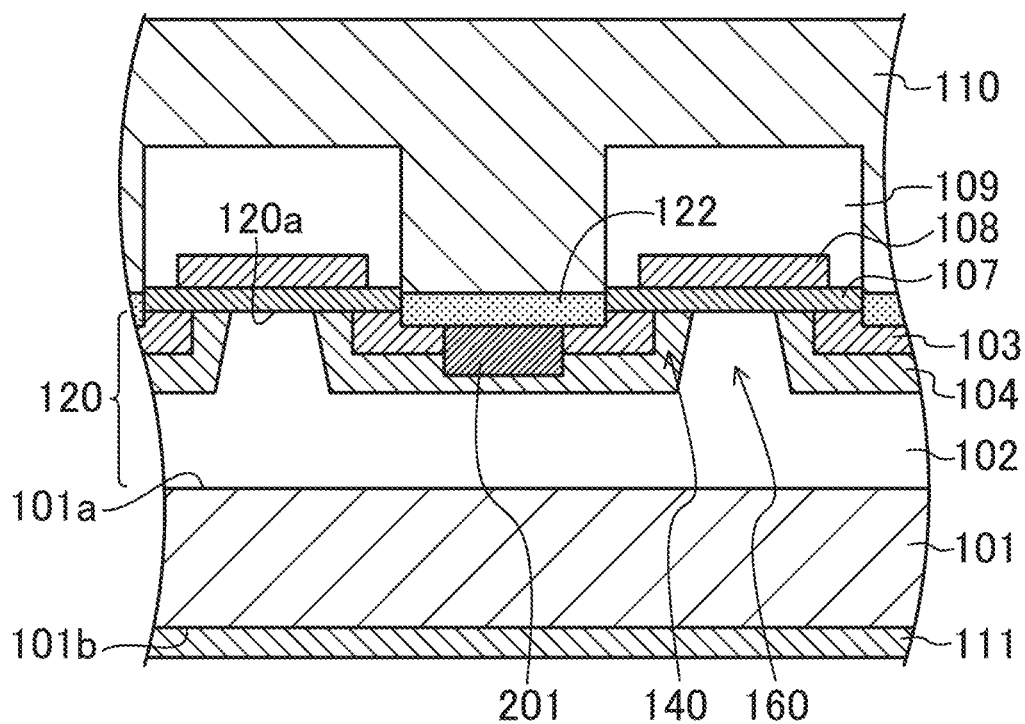
FIG. 19 is a cross-sectional view illustrating a further process step in the method for fabricating a semiconductor device according to the embodiment.

Next, as illustrated in FIG. 19, metal is deposited on the back surface 101b of the semiconductor substrate 101, and is annealed to form a second ohmic electrode 111. For example, Ti is deposited on the back surface 101b, and is then annealed at 950° C. to enable the formation of the second ohmic electrode 111. Thereafter, an interconnect 110 is formed in the contact hole 115 to contact the first ohmic electrode 122, thereby completing a semiconductor device 10.

Figure 20:
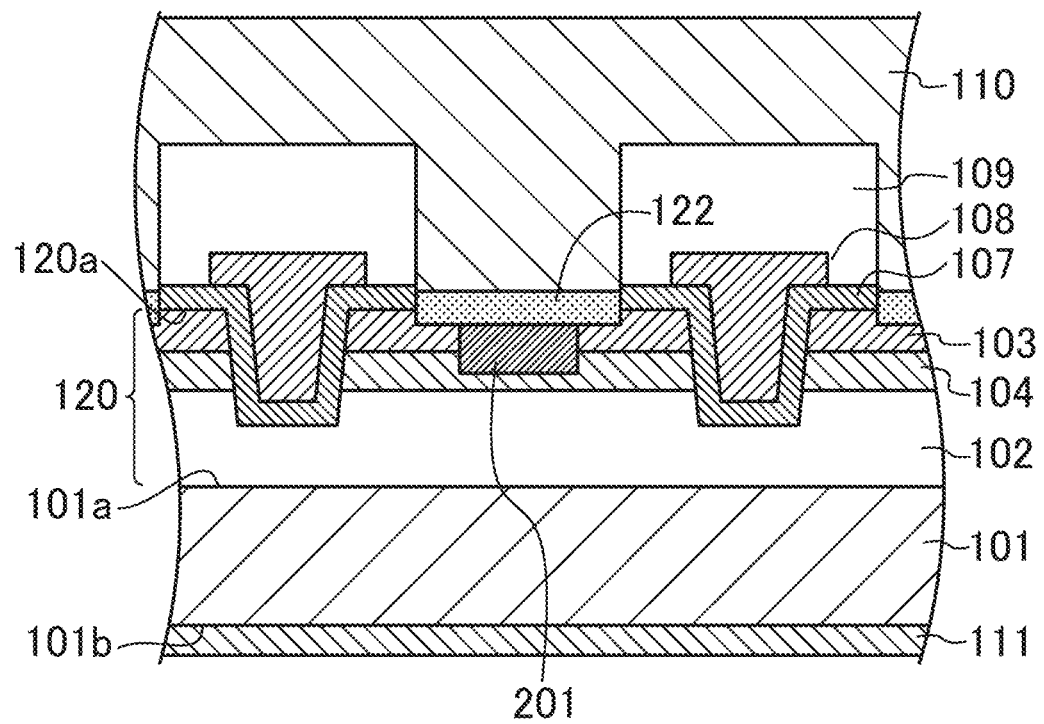
FIG. 20 is a cross-sectional view illustrating a semiconductor device according to a variation of the embodiment.

While the semiconductor device 10 having a planar-type transistor region was described, such a trench-type semiconductor device 11 as illustrated in FIG. 20 may be replaced with the semiconductor device 10. The trench-type semiconductor device 11 can also be fabricated through process steps substantially similar to those for fabricating the planar-type semiconductor device 10.

In a conventional semiconductor device, a p-type contact region is heavily doped with aluminum serving as an impurity, and is not intentionally doped with nitrogen that is an impurity having a conductivity type opposite to that of the p-type contact region. For this reason, the nitrogen concentration in the p-type contact region is usually substantially equal to that in a drift region 102. Thus, when an upper portion of the contact region is silicided to form an ohmic electrode, the nitrogen concentration in the ohmic electrode is about one half of the nitrogen concentration in a combination of the contact region and the drift region. The reason for this is that silicidation causes the volume of a silicided region to be about twice as large as the original volume of the silicided region. Furthermore, since aluminum is segregated, the aluminum concentration in the vicinity of the surface of the ohmic electrode is highest, and the maximum aluminum concentration in the ohmic electrode is higher than the average aluminum concentration in the contact region. This causes the sheet resistance of the ohmic electrode to be high.

In contrast, in the semiconductor device fabrication method illustrated in FIGS. 15(a)-19, the p-type region 201a is below the upper surface of the first silicon carbide semiconductor layer, and the n-type region 201b is closer to the upper surface of the first silicon carbide semiconductor layer than the p-type region 201a. For this reason, the nitrogen concentration in a target region for silicidation is higher than that in a portion of the p-type region 201a that will be the contact region 201. Meanwhile, silicidation causes the volume of a silicided region to be about twice as large as the original volume of the silicided region. Thus, the average nitrogen concentration in the resultant first ohmic electrode 122 is higher than one half of the average nitrogen concentration in a combination of the contact region 201 and the drift region 102. This can facilitate allowing the average nitrogen concentration in the first ohmic electrode 122 to be higher than or equal to $6.9 \times 10^{18}$ cm$^{-3}$ and allowing the minimum nitrogen concentration therein to be higher than or equal to $1.8 \times 10^{18}$ cm$^{-3}$.

The aluminum concentration in a target region for silicidation is reduced to a low level, and for this reason, even when aluminum is segregated, the average aluminum concentration in a region of the first ohmic electrode 122 except a region thereof within 50 nm from the interface between the contact region 201 and the first ohmic electrode 122 can be equal to or lower than $3.0 \times 10^{18}$ cm$^{-3}$, and the maximum aluminum concentration therein can be equal to or lower than $2.4 \times 10^{19}$ cm$^{-3}$. This can reduce the sheet resistance of the first ohmic electrode 122 to a low level. Furthermore, since the depth of the p-type region 201a (the thickness of the n-type region 201b) is determined such that the p-type impurity concentration in a lower end portion of the first ohmic electrode 122 is higher, the contact resistance between the first ohmic electrode 122 and the contact region 201 can be also reduced to a low level.

In the fabrication method illustrated in FIGS. 15(a)-19, an example in which the p-type region 201a is formed below the upper surface 120a of the first silicon carbide semiconductor layer 120 to reduce the aluminum concentration in the vicinity of the surface of the first ohmic electrode 122 was described. However, the aluminum concentration in the vicinity of the surface of the first ohmic electrode 122 can be reduced in the following manner.

First, the structure illustrated in FIG. 15(c) is formed in a manner similar to that in the process steps described above.

Figure 21:
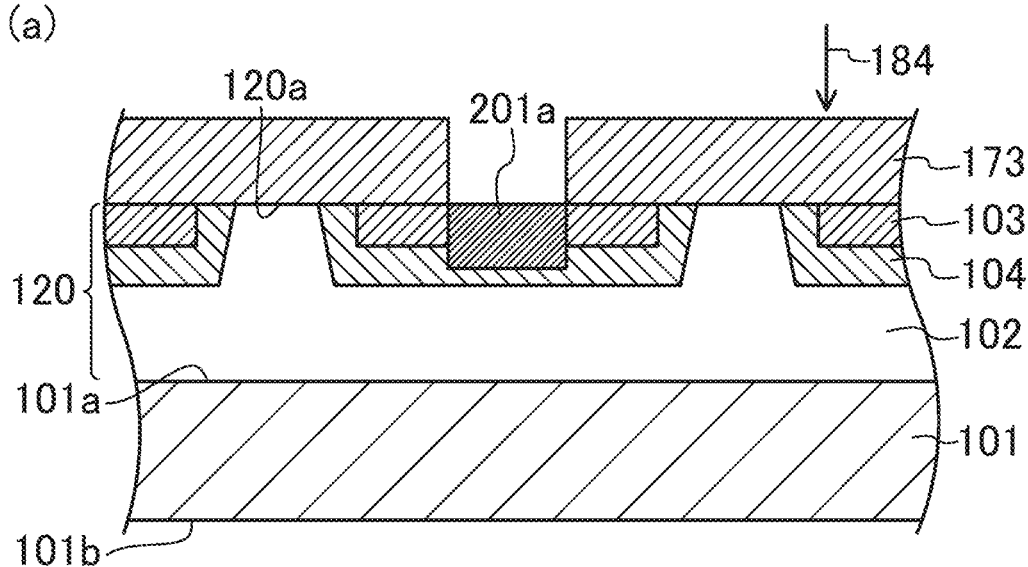
FIGS. 21(a) and 21(b) are cross-sectional views illustrating process steps in a method for fabricating a semiconductor device according to the variation of the embodiment.
Figure 21:
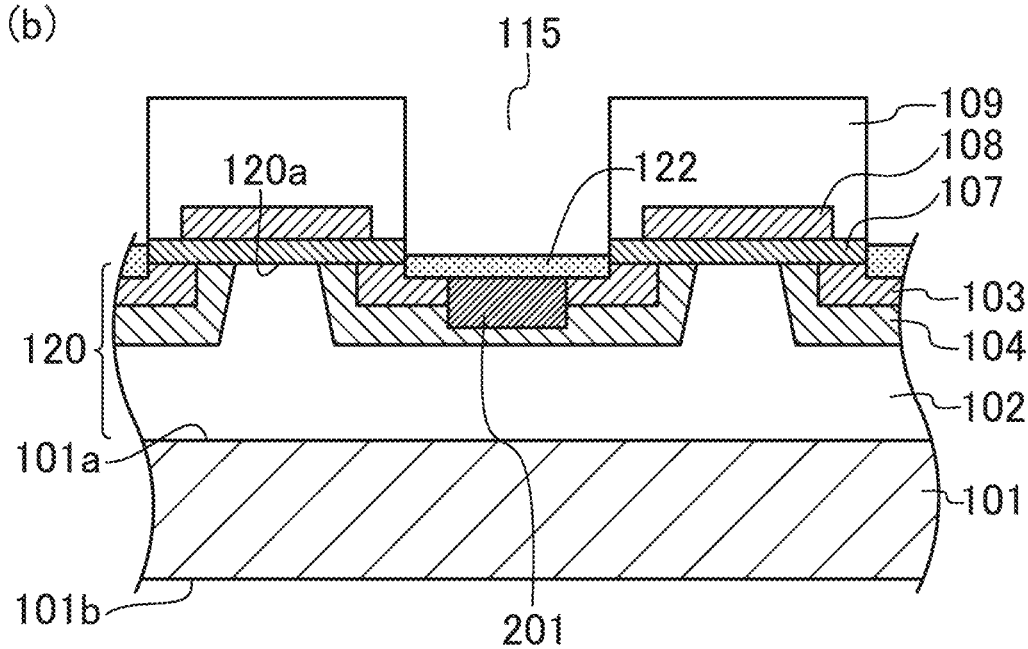

Next, as illustrated in FIG. 21(a), Al⁺ (aluminum ions) 184 are implanted into the first region 104 (as indicated by the arrow) using an implantation mask feature 173 as a mask to form a p-type region 201a. In this case, the ions can be implanted at an energy of 30 keV, an energy of 70 keV, and an energy of 150 keV while the temperature of the semiconductor substrate 101 is kept at, for example, 500° C. When the ions are implanted at an energy of 30 keV, the dose of the ions may be $3.3 \times 10^{15}$ cm$^{-2}$. When the ions are implanted at an energy of 70 keV, the dose of the ions may be $7.2 \times 10^{15}$ cm$^{-2}$. When the ions are implanted at an energy of 150 keV, the dose of the ions may be $3 \times 10^{15}$ cm$^{-2}$. When the ions are implanted at a plurality of energies as described above, the p-type region 201a can have a box profile in which the impurity concentration therein in the depth direction is substantially fixed.

Thereafter, an n-type region 201b is formed in a manner similar to that in the process step illustrated in FIG. 16(b). Furthermore, a first ohmic electrode 122 is formed in a manner similar to that in the process steps illustrated in FIGS. 16(c)-18(b).

Next, as illustrated in FIG. 21(b), the surface of the first ohmic electrode 122 is etched by about 50 nm. The surface of the first ohmic electrode 122 may be etched by anisotropic dry etching using, for example, a CF₄ gas and a CHF₃ gas. The surface of the first ohmic electrode 122 may be etched by wet etching using, for example, an aqueous hydrofluoric acid solution.

In the fabrication method of this variation, the p-type region 201a is formed from the upper surface 120a of the first silicon carbide semiconductor layer 120, and a portion of the upper surface of the first silicon carbide semiconductor layer 120 in which the contact region 201 is to be formed, therefore, contains aluminum at high concentration. For this reason, immediately after a metal silicide layer serving as the first ohmic electrode 122 is formed, aluminum is segregated toward the surface of the metal silicide layer. However, a segregation layer that contains aluminum at high concentration is removed through the process step illustrated in FIG. 21(b). This allows the average aluminum concentration in a region of the first ohmic electrode 122 except a region thereof within 50 nm from the interface between the first ohmic electrode 122 and the contact region 201 to be equal to or lower than $3.0 \times 10^{18}$ cm$^{-3}$, and allows the maximum aluminum concentration therein to be equal to or lower than $2.4 \times 10^{19}$ cm$^{-3}$. Furthermore, the presence of the n-type region 201b allows the average nitrogen concentration in the first ohmic electrode 122 to be higher than or equal to $6.9 \times 10^{18}$ cm$^{-3}$, and allows the minimum nitrogen concentration therein to be higher than or equal to $1.8 \times 10^{18}$ cm$^{-3}$. This can reduce the resistance of the first ohmic electrode 122.

The p-type region 201a having a box profile allows the aluminum concentration at a depth corresponding to the interface between the first ohmic electrode 122 and the contact region 201 to be higher than or equal to $1 \times 10^{20}$ cm$^{-3}$. This can reduce the contact resistance between the first ohmic electrode 122 and the contact region 201 to a low level.

The fabrication method of this variation can be used to fabricate the trench-type semiconductor device 11.

In the fabrication method for the semiconductor device 10, the n-type region is formed on the p-type region by ion implantation. Here, a region containing nitrogen merely needs to exist above the p-type region. For this reason, a silicon carbide semiconductor layer containing nitrogen may be formed on the p-type region without forming a p-type region above the n-type region. Specifically, the structure illustrated in FIG. 22 can be employed. A semiconductor device 12 illustrated in FIG. 22 includes an n-type second silicon carbide semiconductor layer 105 located laterally outward of the first ohmic electrode 122.

Figure 22:
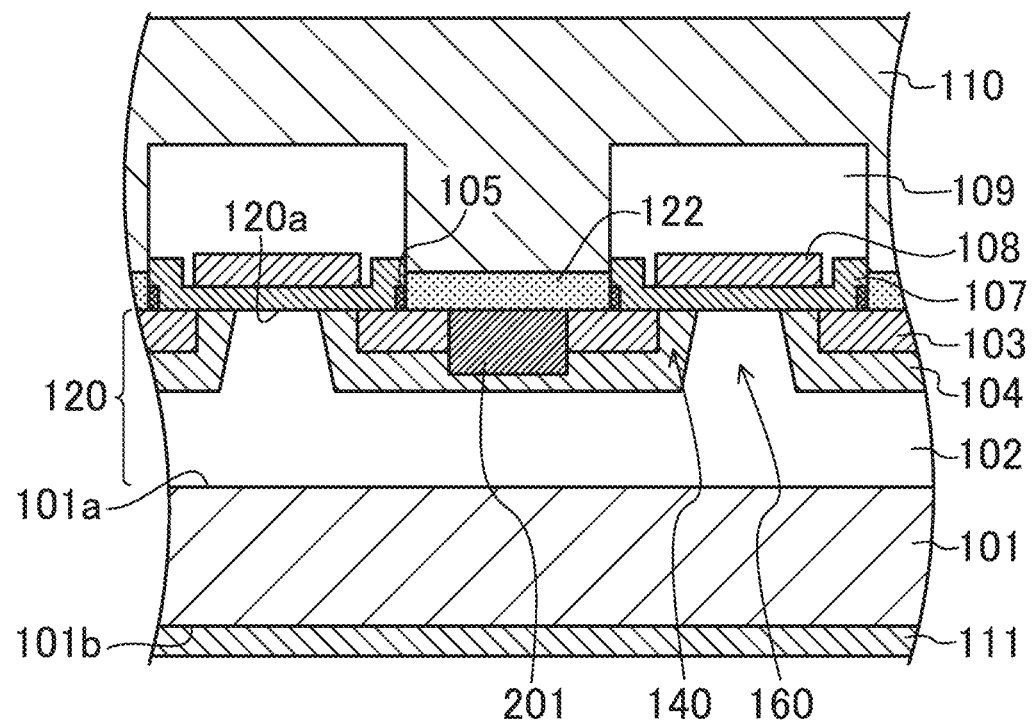
FIG. 22 is a cross-sectional view illustrating a semiconductor device according to another variation of the embodiment.
Figure 23:
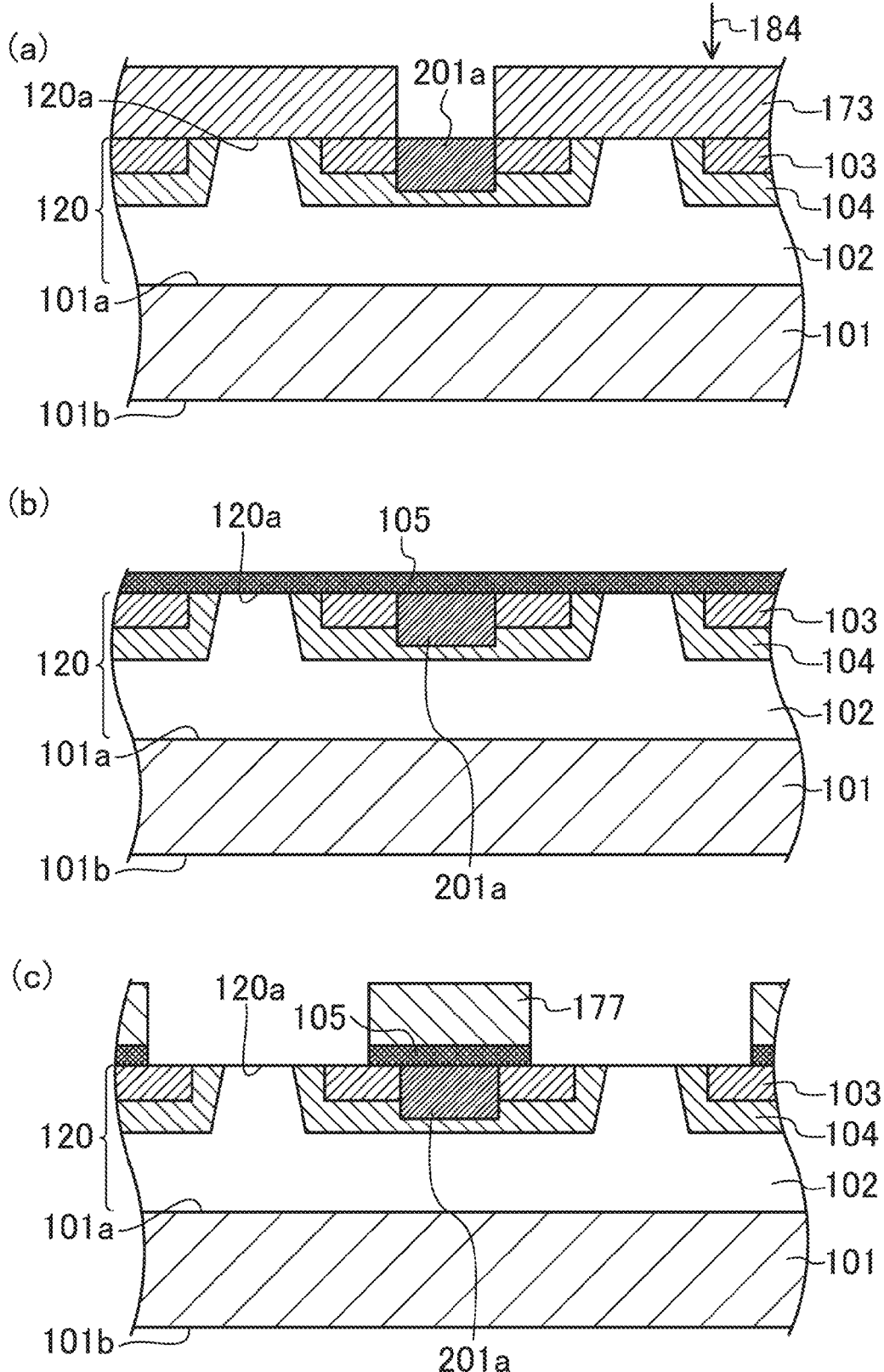
FIGS. 23(a)-23(c) are cross-sectional views illustrating process steps in a method for fabricating a semiconductor device according to the another variation of the embodiment.
Figure 24:
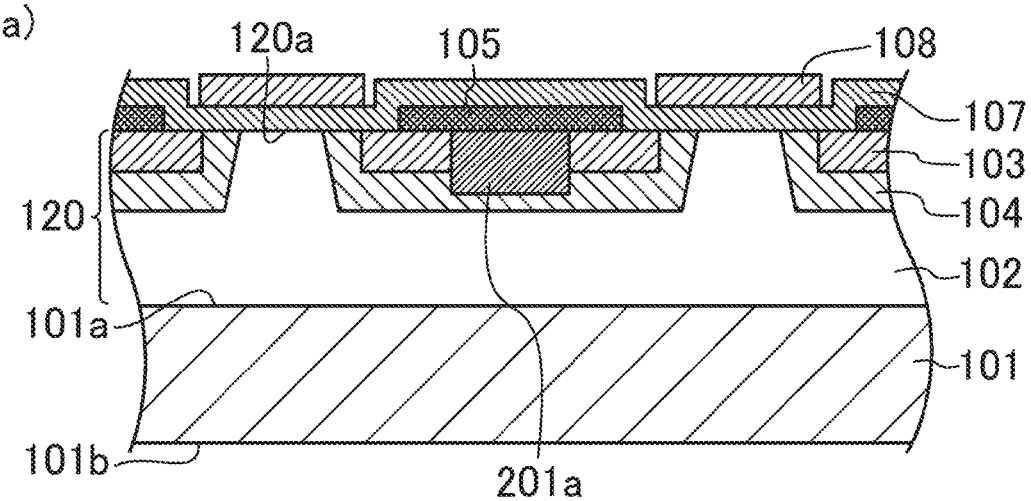
FIGS. 24(a) and 24(b) are cross-sectional views illustrating other process steps in the method for fabricating a semiconductor device according to the another variation of the embodiment.
Figure 24:
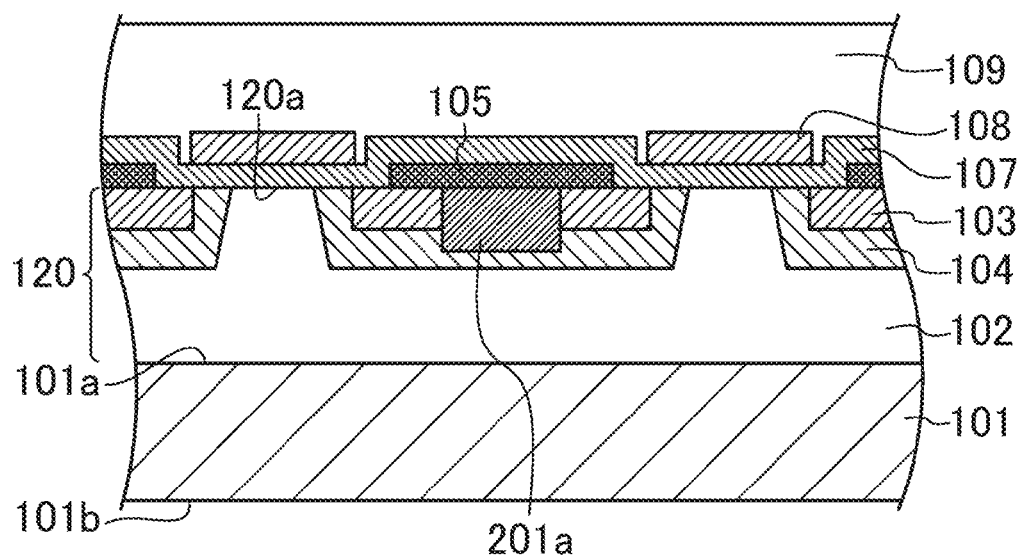
Figure 25:
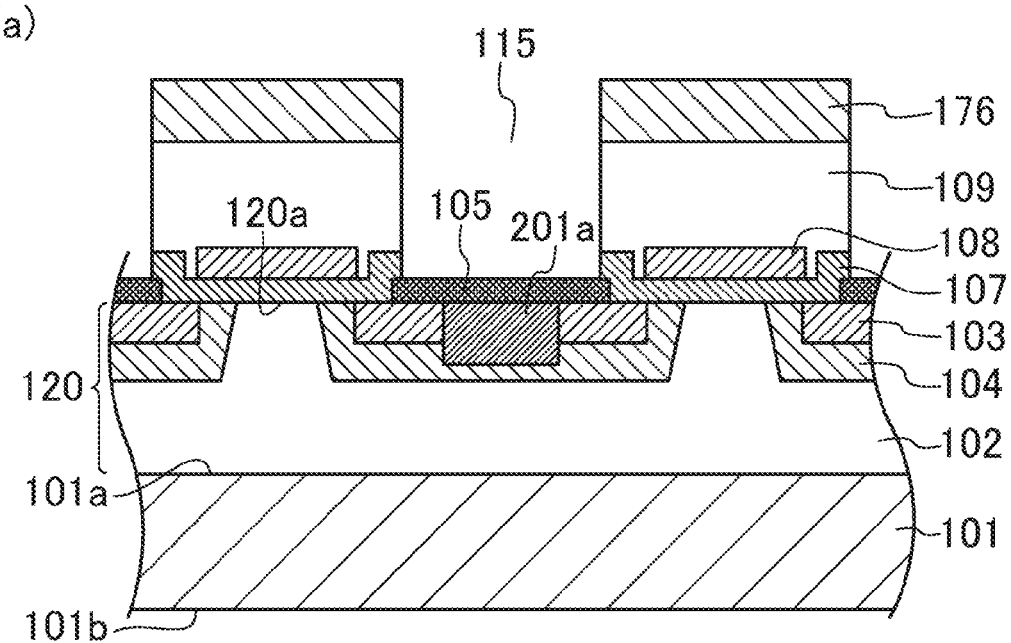
FIGS. 25(a) and 25(b) are cross-sectional views illustrating still other process steps in the method for fabricating a semiconductor device according to the another variation of the embodiment.
Figure 25:
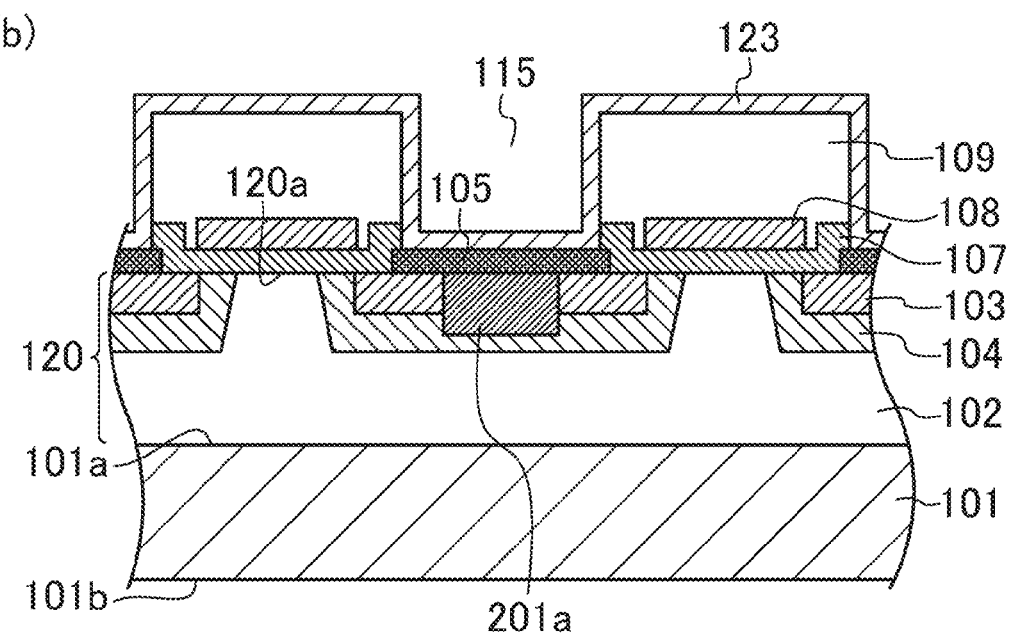
Figure 26:
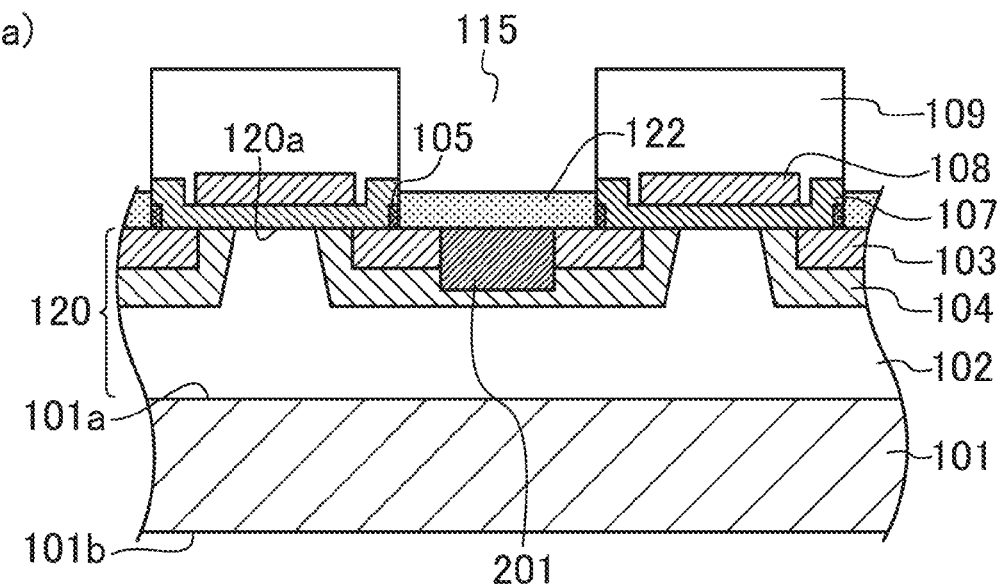
FIGS. 26(a) and 26(b) are cross-sectional views illustrating yet other process steps in the method for fabricating a semiconductor device according to the another variation of the embodiment.
Figure 26:
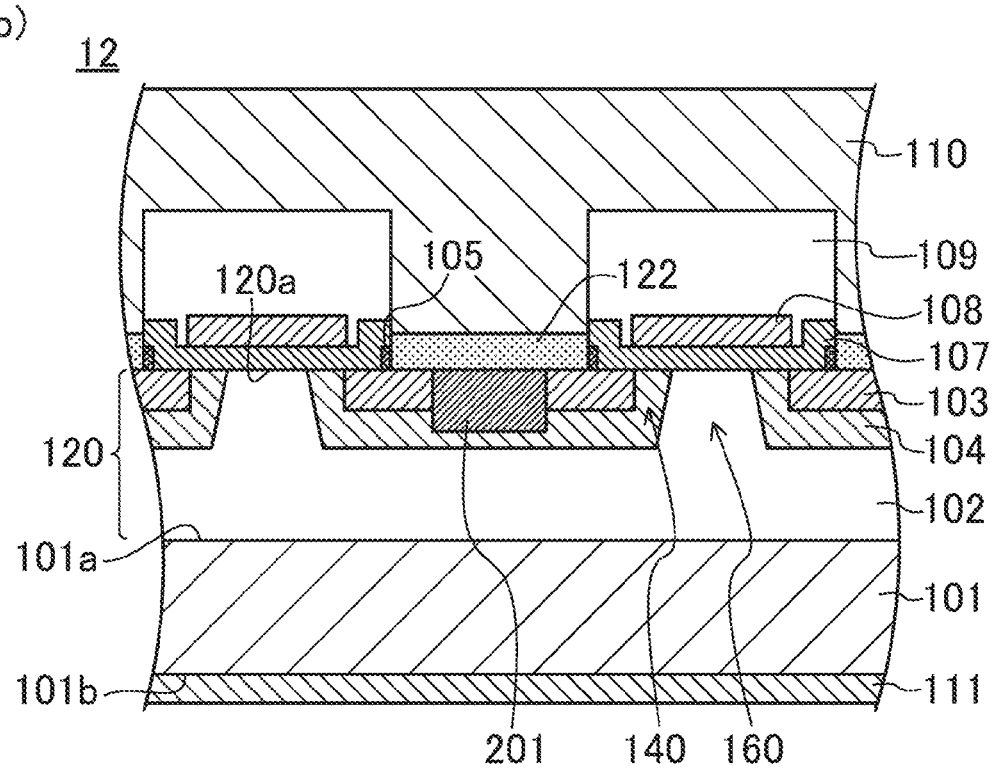

In FIG. 22, the interface between a first ohmic electrode 122 and a group of a contact region 201 and a second region 103 is aligned with the interface between the second silicon carbide semiconductor layer 105 and the second region 103. However, the interface between the first ohmic electrode 122 and the group of the contact region 201 and the second region 103 does not need to be aligned with the interface between the second silicon carbide semiconductor layer 105 and the second region 103. For example, the interface between the first ohmic electrode 122 and the group of the contact region 201 and the second region 103 may be below the interface between the second silicon carbide semiconductor layer 105 and the second region 103.

The semiconductor device 12 can be fabricated in the following manner. FIGS. 23(a)-26(b) illustrate fabrication process steps for the semiconductor device 12.

First, the structure illustrated in FIG. 15(c) is formed in a manner similar to that in the process steps for fabricating the semiconductor device 10. Next, as illustrated in FIG. 23(a), aluminum ions (Al⁺) 184 are implanted into the first region 104 (as indicated by the arrow) using an implantation mask feature 173 as a mask to form a p-type region 201a. In this case, the ions can be implanted thereinto at an energy of 30 keV, an energy of 70 keV, and an energy of 150 keV while the temperature of the semiconductor substrate 101 is kept at, for example, 500° C. When the ions are implanted at an energy of 30 keV, the dose of the ions may be $3.3 \times 10^{15}$ cm$^{-2}$. When the ions are implanted at an energy of 70 keV, the dose of the ions may be $7.2 \times 10^{15}$ cm$^{-2}$. When the ions are implanted at an energy of 150 keV, the dose of the ions may be $3 \times 10^{15}$ cm$^{-2}$. When the ions are implanted at a plurality of energies as described above, the p-type region 201a can have a box profile in which the impurity concentration therein in the depth direction is substantially fixed. Subsequently, the implantation mask feature 173 is removed, and the semiconductor substrate 101 is then annealed at a temperature of higher than or equal to 1000° C. to activate the impurity. The temperature at which the semiconductor substrate 101 is annealed can be, for example, 1800° C.

Next, as illustrated in FIG. 23(b), a second silicon carbide semiconductor layer 105 is formed on the first silicon carbide semiconductor layer 120. The second silicon carbide semiconductor layer 105 may be epitaxially grown by thermal CVD using, for example, silane (SiH₄) and propane (C₃H₈) as a source gas, hydrogen (H₂) as a carrier gas, and nitrogen (N₂) as a dopant gas. The second silicon carbide semiconductor layer 105 can have an n-type impurity concentration of higher than or equal to, for example, $1 \times 10^{18}$ cm$^{-3}$, and can have a thickness of, for example, greater than or equal to 30 nm and equal to or less than 150 nm. The second silicon carbide semiconductor layer 105 may have a fixed impurity concentration profile in the thickness direction, or have a profile in which the impurity concentration in a portion of the second silicon carbide semiconductor layer 105 is high. When the impurity concentration in a portion of the second silicon carbide semiconductor layer 105 is high, a nitrogen (N₂) gas may be introduced into the second silicon carbide semiconductor layer 105 being grown such that a portion of the second silicon carbide semiconductor layer 105 contains nitrogen at high concentration.

Next, as illustrated in FIG. 23(c), a photoresist 177 is formed on the second silicon carbide semiconductor layer 105, and the second silicon carbide semiconductor layer 105 is then etched using the photoresist 177 as a mask. The second silicon carbide semiconductor layer 105 may be etched by dry etching using, for example, a mixture of $CF_4$ and $O_2$.

Next, as illustrated in FIG. 24(a), the photoresist 177 is removed, and a gate insulating film ($SiO_2$) 107 is then formed on remaining portions of the second silicon carbide semiconductor layer 105 and the first silicon carbide semiconductor layer 120. Subsequently, a gate electrode material (poly-Si) is formed on the gate insulating film 107. Thereafter, a photoresist (not shown) is formed on the gate electrode material, the gate electrode material is etched to form a gate electrode 108, and the photoresist is removed.

Next, as illustrated in FIG. 24(b), an interlayer insulating film 109 is formed on the first silicon carbide semiconductor layer 120 to cover the gate electrode 108. The interlayer insulating film 109 may be made of, for example, silicon dioxide ($SiO_2$), and may have a thickness of, for example, 1000 nm.

Next, as illustrated in FIG. 25(a), the interlayer insulating film 109 is etched using a photoresist 176 as a mask to form a contact hole 115. The interlayer insulating film 109 may be etched by dry etching using, for example, a mixture of $CHF_3$ and $O_2$.

Next, as illustrated in FIG. 25(b), the photoresist 176 is removed, and nickel (Ni) is deposited in at least the contact hole 115 in the form of a contact metal 123.

Next, as illustrated in FIG. 26(a), the contact metal 123 is silicided by annealing to form a first ohmic electrode 122. Thereafter, unreacted portions of the contact metal 123 are removed. The first ohmic electrode 122 contacts the second region 103 and the first region 104. In this case, for example, the thickness of the contact metal 123 and the time period during which the contact metal 123 is annealed are determined such that a portion of the second silicon carbide semiconductor layer 105 can be silicided from top to bottom.

This configuration prevents a target region for silicidation from substantially containing aluminum, and allows the nitrogen concentration in the target region to be higher than or equal to $1 \times 10^{18}$ cm$^{-3}$. The average aluminum concentration in a region of a first ohmic electrode except a region thereof within 50 nm from the interface between the first ohmic electrode and a contact region can be equal to or lower than $3.0 \times 10^{18}$ cm$^{-3}$, and the maximum aluminum concentration therein can be equal to or lower than $2.4 \times 10^{19}$ cm$^{-3}$. Since the second silicon carbide semiconductor layer 105 containing nitrogen is silicided, the average nitrogen concentration in the first ohmic electrode 122 can be higher than or equal to $6.9 \times 10^{18}$ cm$^{-3}$, and the minimum nitrogen concentration therein can be higher than or equal to $1.8 \times 10^{18}$ cm$^{-3}$. This can reduce the sheet resistance of the first ohmic electrode 122.

Instead of only a portion of the second silicon carbide semiconductor layer 105, an upper portion of the contact region 201 and a portion of the second silicon carbide semiconductor layer 105 may be silicided. The contact region 201 may be silicided to a depth of about 35 nm, depending on the aluminum concentration in the contact region 201.

Next, as illustrated in FIG. 26(b), metal is deposited on the back surface 101b of the semiconductor substrate 101, and is annealed to form a second ohmic electrode 111. For example, Ti is deposited on the back surface 101b, and is then annealed at 950° C. to enable the formation of the second ohmic electrode 111. Thereafter, an interconnect 110 is formed in the contact hole 115 to contact the first ohmic electrode 122, thereby completing a semiconductor device 12.

Figure 27:
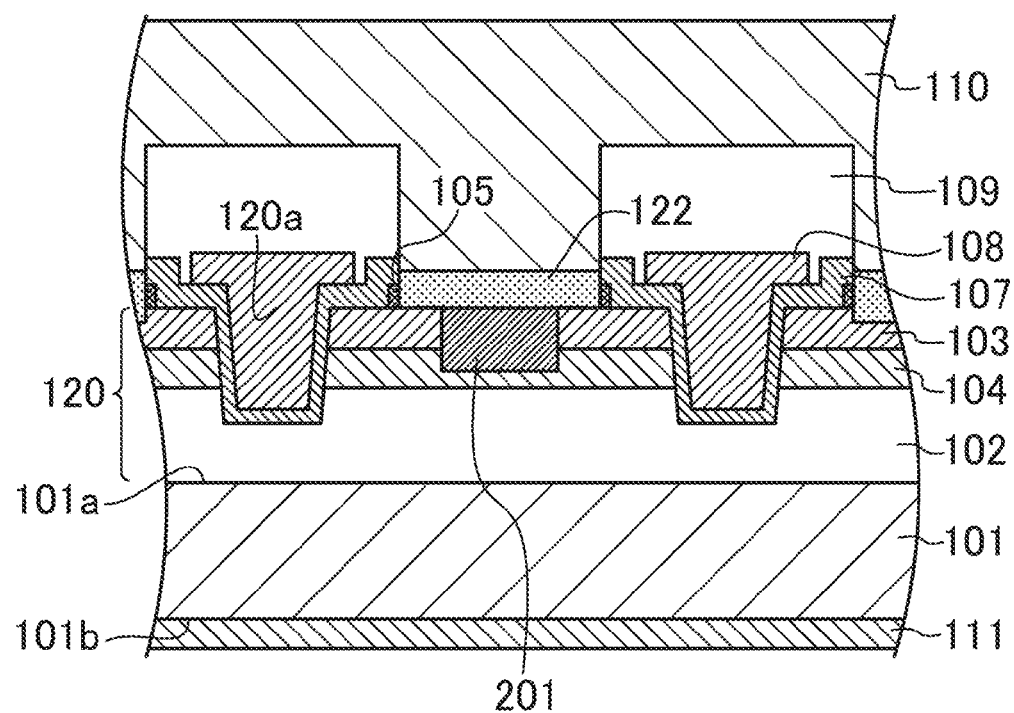
FIG. 27 is a cross-sectional view illustrating a semiconductor device according to still another variation of the embodiment.

Such a semiconductor device 13 having a trench-type transistor region as illustrated in FIG. 27 also provides similar advantages. The trench-type semiconductor device 13 can be also fabricated through process steps substantially similar to those for fabricating the planar-type semiconductor device 12.

Figure 28:
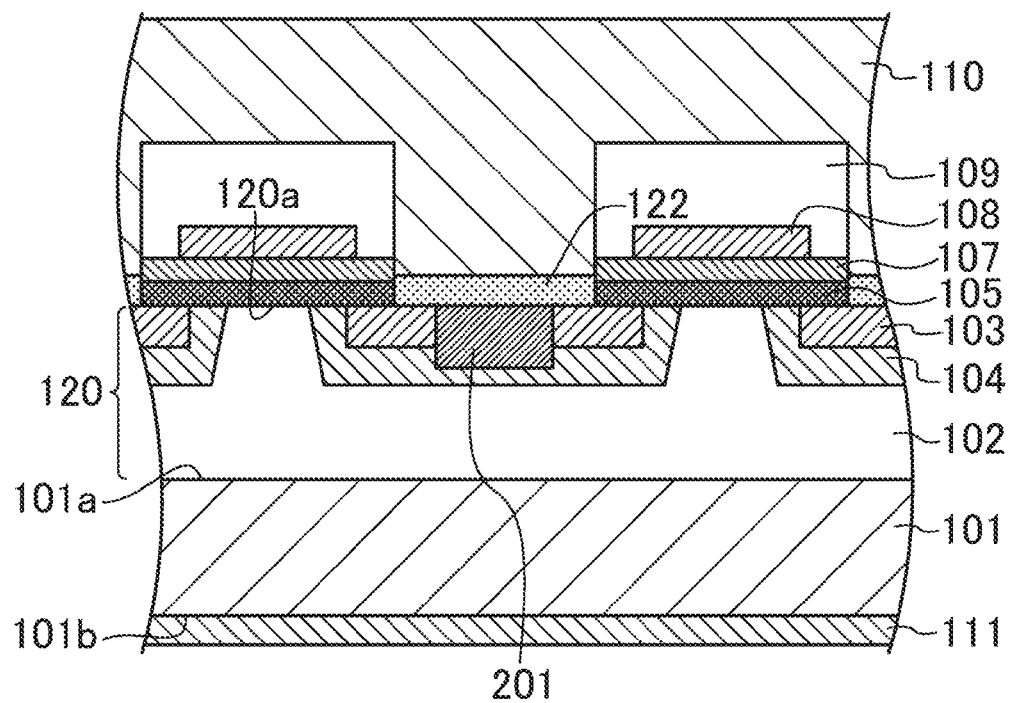
FIG. 28 is a cross-sectional view illustrating a semiconductor device according to yet another variation of the embodiment.

Such a semiconductor device 14 as illustrated in FIG. 28 also provides substantially similar advantages. As illustrated in FIG. 28, the semiconductor device 14 includes a second silicon carbide semiconductor layer 105 spreading across the boundary between a second region 103 and a current path region 140 and across the boundary between a JFET region 160 and the current path region 140. A portion of the second silicon carbide semiconductor layer 105 between a gate electrode 108 and a first region 104 functions as an accumulation channel. The second silicon carbide semiconductor layer 105 may have a thickness of, for example, greater than or equal to 30 nm and equal to or less than 150 nm. Typically, to activate an implanted impurity, annealing needs to be performed at a high temperature of higher than or equal to 1000° C., preferably higher than or equal to 1600° C. However, in activation annealing, for example, step bunching may occur at the silicon carbide surface to reduce the mobility of carriers. The formation of the second silicon carbide semiconductor layer 105 enables the obtainment of a smooth silicon carbide surface at which no step bunching occurs.

In FIG. 28, the interface between a first ohmic electrode 122 and a group of a contact region 201 and the second region 103 is aligned with the interface between the second silicon carbide semiconductor layer 105 and the second region 103. However, the interface between the first ohmic electrode 122 and the group of the contact region 201 and the second region 103 does not need to be aligned with the interface between the second silicon carbide semiconductor layer 105 and the second region 103. For example, the interface between the first ohmic electrode 122 and the group of the contact region 201 and the second region 103 may be below the interface between the second silicon carbide semiconductor layer 105 and the second region 103.

The semiconductor device 14 can be fabricated in the following manner. FIGS. 29(a)-31(b) illustrate fabrication process steps for the semiconductor device 14.

First, the structure illustrated in FIG. 15(c) is formed in a manner similar to that in the process steps for fabricating the semiconductor device 10.

Next, as illustrated in FIG. 29(a), Al$^+$ (aluminum ions) 184 are implanted into a first region 104 (as indicated by the arrow) using an implantation mask feature 173 as a mask to form a p-type region 201a. In this case, the ions can be implanted thereinto at an energy of 30 keV, an energy of 70 keV, and an energy of 150 keV while the temperature of the semiconductor substrate 101 is kept at, for example, 500° C. When the ions are implanted at an energy of 30 keV, the dose of the ions may be $3.3 \times 10^{15}$ cm$^{-2}$. When the ions are implanted at an energy of 70 keV, the dose of the ions may be $7.2 \times 10^{15}$ cm$^{-2}$. When the ions are implanted at an energy of 150 keV, the dose of the ions may be $3 \times 10^{15}$ cm$^{-2}$. When the ions are implanted at a plurality of energies as described above, the p-type region 201a can have a box profile in which the impurity concentration therein in the depth direction is substantially fixed. Subsequently, the implantation mask feature 173 is removed, and the semiconductor substrate 101 is then annealed at a temperature of higher than or equal to 1000° C. to activate the impurity. The temperature at which the semiconductor substrate 101 is annealed can be, for example, 1800° C.

Next, as illustrated in FIG. 29(b), a second silicon carbide semiconductor layer 105 is formed on the first silicon carbide semiconductor layer 120. The second silicon carbide semiconductor layer 105 may be epitaxially grown by thermal CVD using, for example, silane ($SiH_4$) and propane ($C_3H_8$) as a source gas, hydrogen ($H_2$) as a carrier gas, and nitrogen ($N_2$) as a dopant gas. The second silicon carbide semiconductor layer 105 can have an n-type impurity concentration of higher than or equal to, for example, $1\times10^{17}$ $cm^{-3}$, preferably higher than or equal to $1\times10^{18}$ $cm^{-3}$, and can have a thickness of, for example, greater than or equal to 30 nm and equal to or less than 150 nm. The second silicon carbide semiconductor layer 105 may have a fixed impurity concentration profile in the thickness direction, or have a profile in which the impurity concentration in a portion of the second silicon carbide semiconductor layer 105 is high. When the impurity concentration in a portion of the second silicon carbide semiconductor layer 105 is high, a nitrogen ($N_2$) gas may be introduced into the second silicon carbide semiconductor layer 105 being grown such that a portion of the second silicon carbide semiconductor layer 105 contains nitrogen at high concentration.

Figure 29:
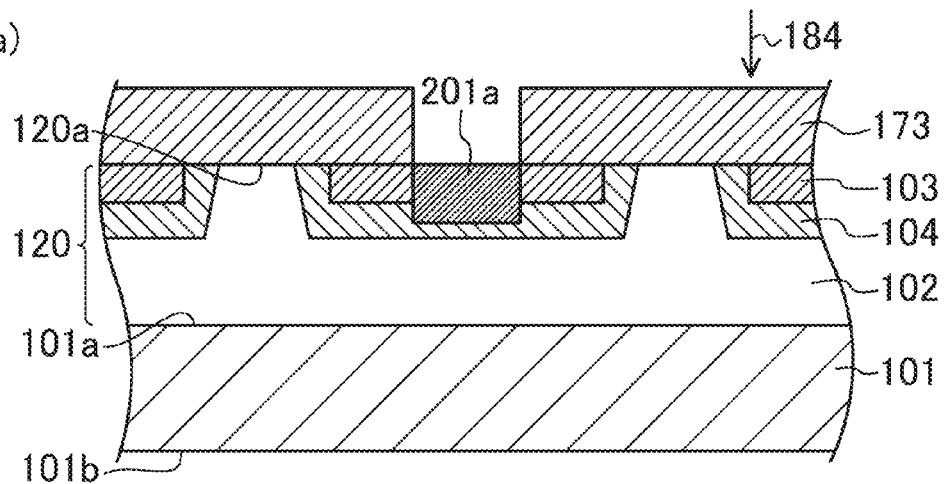
FIGS. 29(a)-29(c) are cross-sectional views illustrating process steps in a method for fabricating a semiconductor device according to the yet another variation of the embodiment.
Figure 29:
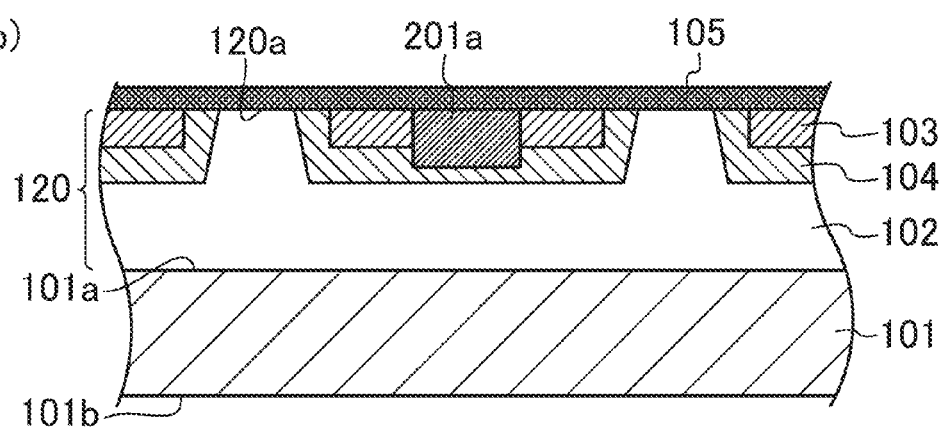
Figure 29:
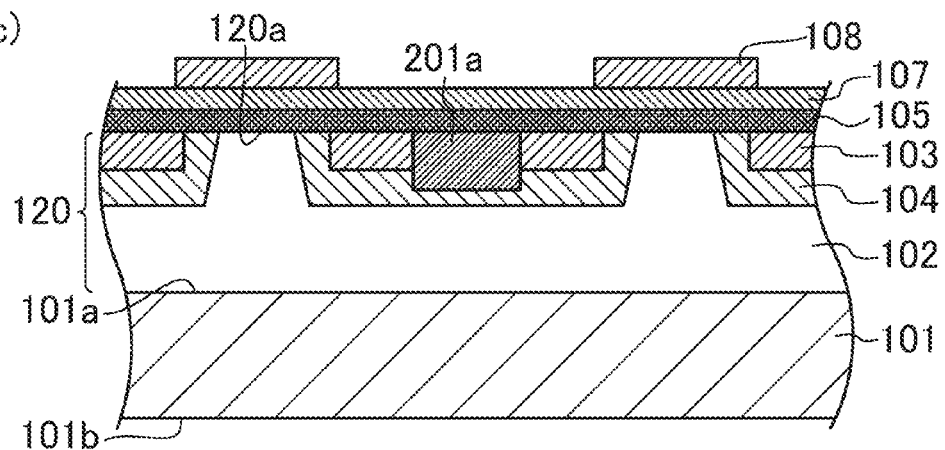

Next, as illustrated in FIG. 29(*c*), a gate insulating film ($SiO_2$) 107 is formed on the second silicon carbide semiconductor layer 105, and a gate electrode material (poly-Si) is subsequently formed on the gate insulating film 107. Thereafter, a photoresist (not shown) is formed on the gate electrode material, the gate electrode material is etched to form a gate electrode 108, and the photoresist is removed.

Figure 30:
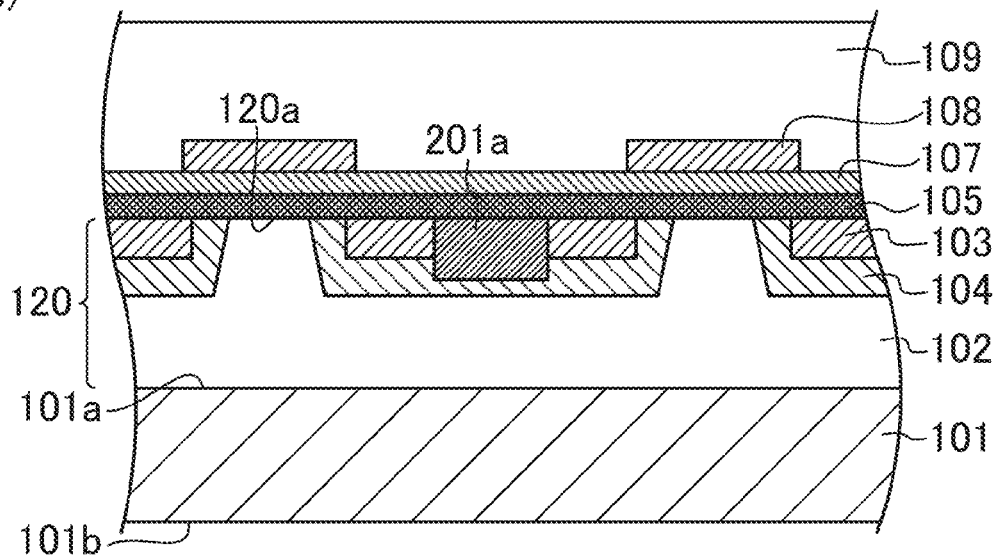
FIGS. 30(a) and 30(b) are cross-sectional views illustrating other process steps in the method for fabricating a semiconductor device according to the yet another variation of the embodiment.
Figure 30:
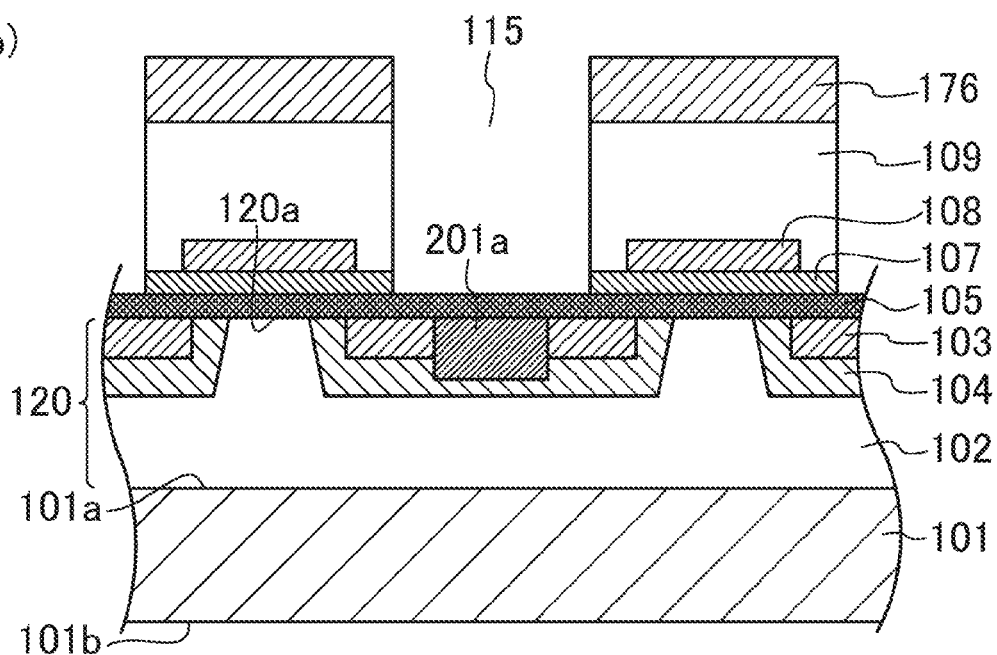

Next, as illustrated in FIG. 30(*a*), an interlayer insulating film 109 is formed on the first silicon carbide semiconductor layer 120 to cover the gate electrode 108. The interlayer insulating film 109 may be made of, for example, silicon dioxide ($SiO_2$), and may have a thickness of, for example, 1000 nm.

Next, as illustrated in FIG. 30(*b*), the interlayer insulating film 109 is etched using a photoresist 176 as a mask to form a contact hole 115. The interlayer insulating film 109 may be etched by dry etching using, for example, a mixture of $CHF_3$ and $O_2$.

Figure 31:
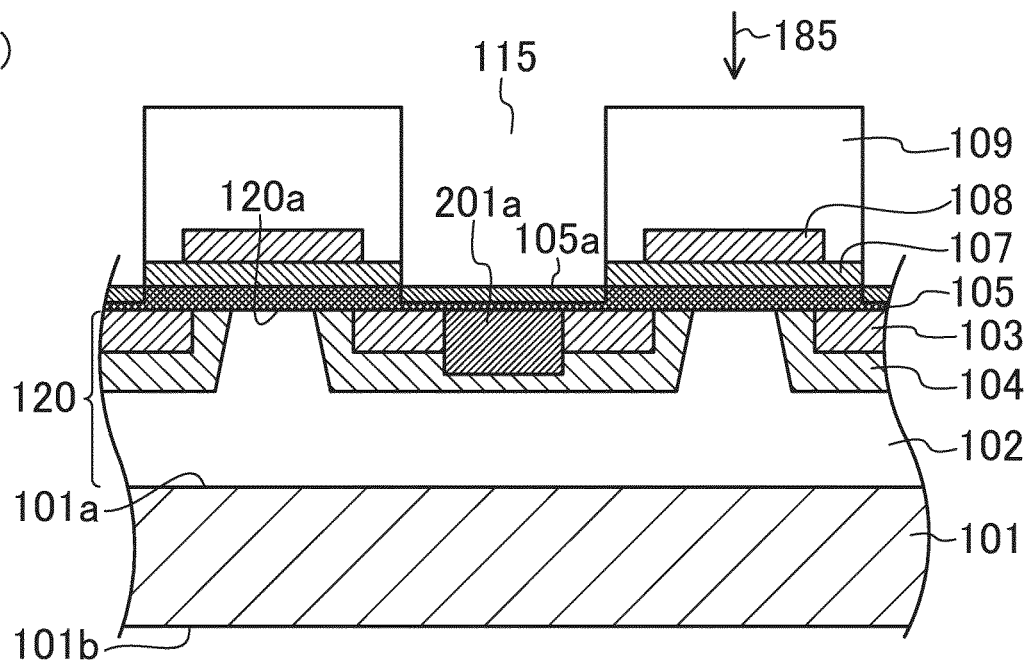
FIGS. 31(a) and 31(b) are cross-sectional views illustrating still other process steps in the method for fabricating a semiconductor device according to the yet another variation of the embodiment.
Figure 31:
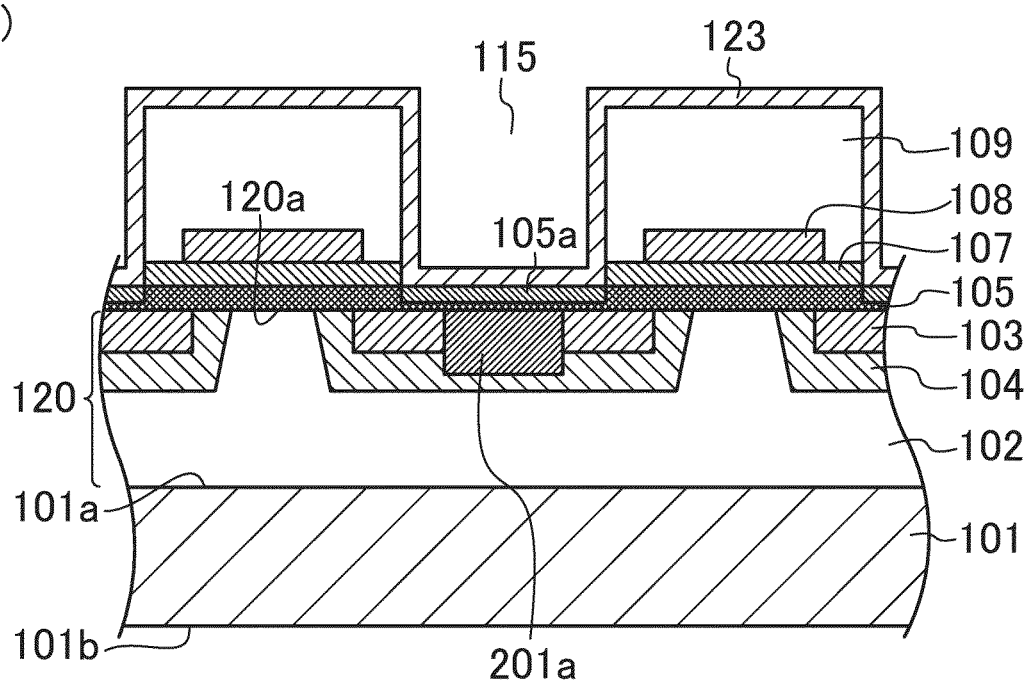

Next, as illustrated in FIG. 31(*a*), the photoresist 176 is removed, and nitrogen ions ($N^+$) 185 are then implanted into the second silicon carbide semiconductor layer 105 (as indicated by the arrow) using the interlayer insulating film 109 as a mask, thereby forming an n-type impurity region 105*a* in the second silicon carbide semiconductor layer 105. The nitrogen ions may be implanted, for example, at an energy of 30 keV and a dose of $5\times10^{14}$ $cm^{-2}$. In this implantation, the temperature of the semiconductor substrate 101 may be equal to room temperature. The ions may be implanted into the second silicon carbide semiconductor layer 105 with the photoresist 176 remaining. In this case, the photoresist 176 may be removed after the ion implantation.

When the nitrogen concentration in the second silicon carbide semiconductor layer 105 is higher than or equal to $5\times10^{17}$ $cm^{-3}$, more preferably higher than or equal to $1\times10^{18}$ $cm^{-3}$, the process step illustrated in FIG. 31(*a*) may be omitted.

Next, as illustrated in FIG. 31(*b*), nickel (Ni) is deposited in at least the contact hole 115 in the form of a contact metal 123.

Figure 32:
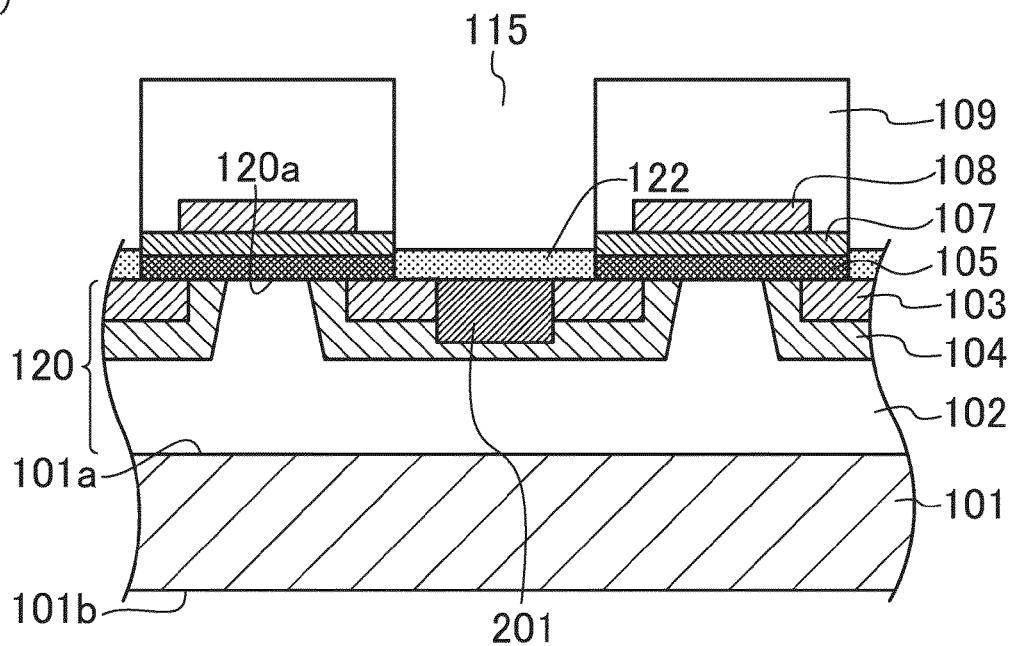
FIGS. 32(a) and 32(b) are cross-sectional views illustrating yet other process steps in the method for fabricating a semiconductor device according to the yet another variation of the embodiment.
Figure 32:
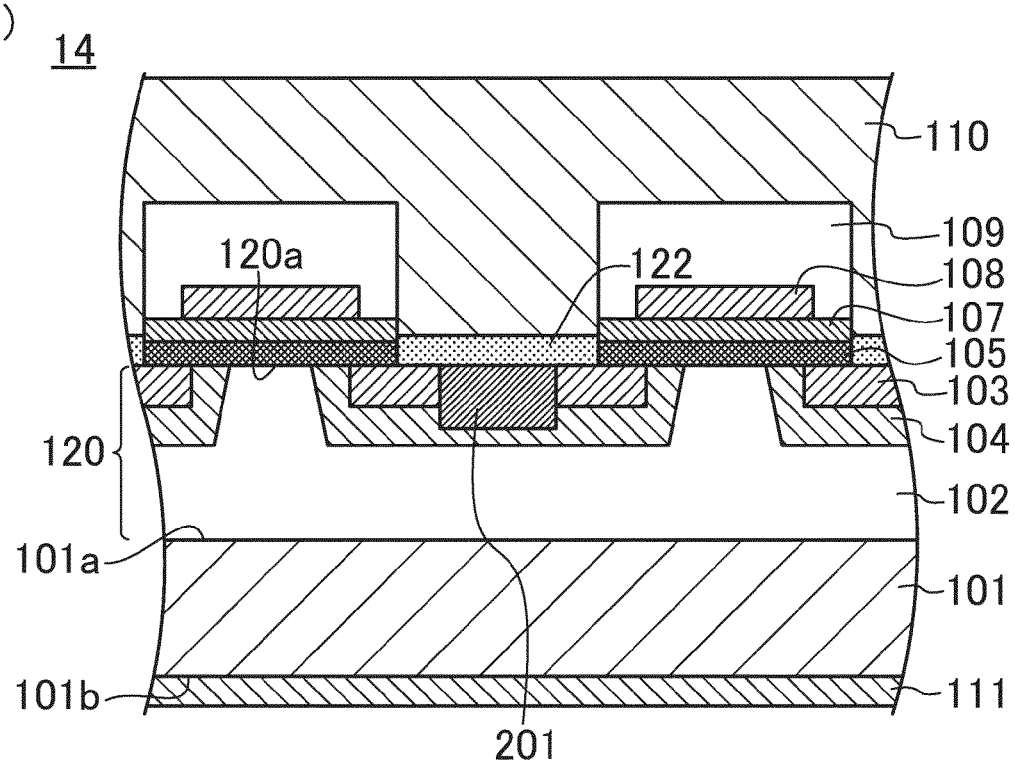

Next, as illustrated in FIG. 32(*a*), the contact metal 123 is silicided by annealing to form a first ohmic electrode 122. Thereafter, unreacted portions of the contact metal 123 are removed. The first ohmic electrode 122 contacts the second region 103 and the first region 104. In this case, for example, the thickness of the contact metal 123 and the time period during which the contact metal 123 is annealed are determined such that a portion of the second silicon carbide semiconductor layer 105 can be silicided from top to bottom.

This configuration allows the aluminum concentration in a target region for silicidation to be equal to or lower than $1\times10^{18}$ $cm^{-3}$, and allows the nitrogen concentration therein to be higher than or equal to $1\times10^{17}$ $cm^{-3}$. The average aluminum concentration in a region of a first ohmic electrode except a region thereof within 50 nm from the interface between the first ohmic electrode and a contact region can be equal to or lower than $3.0\times10^{18}$ $cm^{-3}$, and the maximum aluminum concentration therein can be equal to or lower than $2.4\times10^{19}$ $cm^{-3}$. Since the second silicon carbide semiconductor layer 105 containing nitrogen is silicided, the average nitrogen concentration in the first ohmic electrode 122 can be higher than or equal to $6.9\times10^{18}$ $cm^{-3}$, and the minimum nitrogen concentration therein can be higher than or equal to $1.8\times10^{18}$ $cm^{-3}$. This can reduce the sheet resistance of the first ohmic electrode 122.

Instead of only a portion of the second silicon carbide semiconductor layer 105, an upper portion of the contact region 201 and a portion of the second silicon carbide semiconductor layer 105 may be silicided. The contact region 201 may be silicided to a depth of about 35 nm, depending on the aluminum concentration in the contact region 201.

Next, as illustrated in FIG. 32(*b*), metal is deposited on the back surface 101*b* of the semiconductor substrate 101, and is annealed to form a second ohmic electrode 111. For example, Ti is deposited on the back surface 101*b*, and is then annealed at 950° C. to enable the formation of the second ohmic electrode 111. Thereafter, an interconnect 110 is formed in the contact hole 115 to contact the first ohmic electrode 122, thereby completing a semiconductor device 14.

Figure 33:
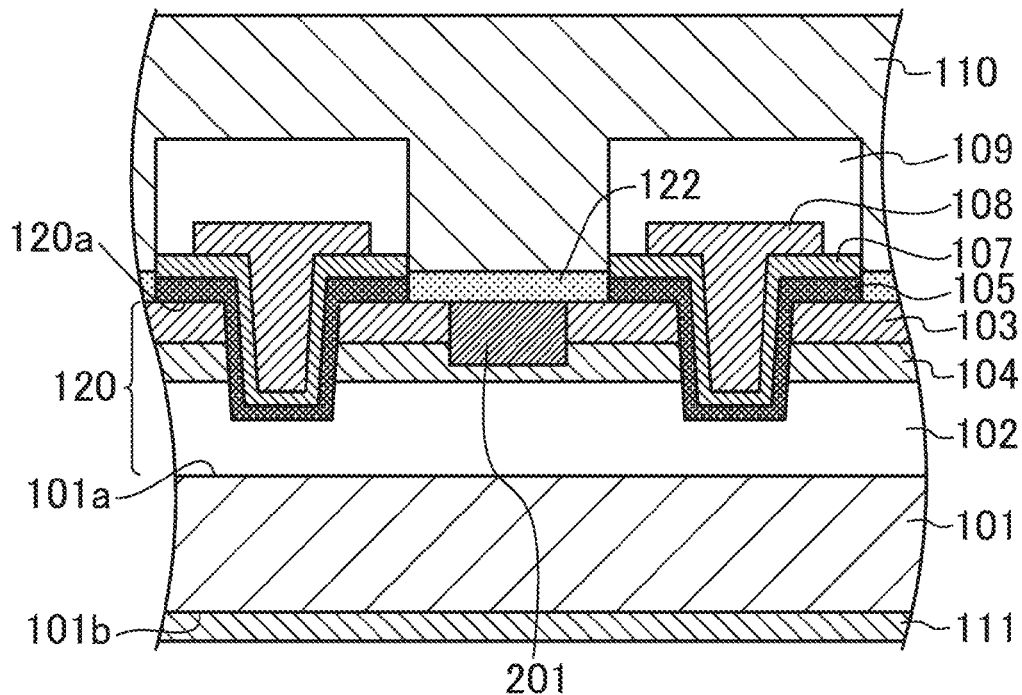
FIG. 33 is a cross-sectional view illustrating a semiconductor device according to a further variation of the embodiment.

Such a semiconductor device 15 having a trench-type transistor region as illustrated in FIG. 33 also provides similar advantages. The trench-type semiconductor device 15 can be also fabricated through process steps substantially similar to those for fabricating the planar-type semiconductor device 14.

Next, a first ohmic electrode 122 of a semiconductor device 14 having the configuration was actually prepared, and the results of determining the performance of the first ohmic electrode 122 will be described. The first ohmic electrode 122 used to determine the performance was formed in the following manner.

The thickness of a first silicon carbide semiconductor layer 120 was 10 μm, and the impurity concentration in the first silicon carbide semiconductor layer 120 was $1\times10^{16}$ $cm^{-3}$. A contact region 201 was formed by implanting aluminum ions ($Al^+$) into the first silicon carbide semiconductor layer 120. Aluminum ions were implanted thereinto three times. The ions were implanted at energies of 150 keV, 70 keV, and 30 keV and doses of $2.8\times10^{15}$ $cm^{-2}$, $1.2\times10^{15}$ $cm^{-2}$, and $5.5\times10^{14}$ $cm^{-2}$, respectively. The impurity was activated at 1700° C. for 30 minutes. A cap layer made of carbon was formed on the first silicon carbide semiconductor layer 120, and in this state, the first silicon carbide semiconductor layer 120 was activated. After the activation, annealing was performed at 1200° C., and an about-30-nm-thick thermal oxide film was formed on the surface of the first silicon carbide semiconductor layer 120. The formed thermal oxide film was removed by etching, and an n-type second silicon carbide semiconductor layer 105 was then formed on the first silicon carbide semiconductor layer 120. The second silicon carbide semiconductor layer 105 includes a 30-nm-thick first undoped layer, a 10-nm-thick high-concentration impurity layer, and a 56-nm-thick second undoped layer which were sequentially stacked on the first silicon carbide semiconductor layer 120. An impurity in the high-concentration impurity layer was nitrogen, and the impurity concentration therein was $8\times10^{17}$ $cm^{-3}$. Next, a gate insulating film made of silicon dioxide was temporarily formed on the second silicon carbide semiconductor layer 105, and the gate insulating film was then removed by dry etching using a mixture of $CHF_3$ and $O_2$. The thickness of the second silicon carbide semiconductor layer 105 after the removal of the gate insulating film was about 65 nm After the gate insulating film was removed, a nickel film having a thickness of 100 nm or 125 nm was formed on the second silicon carbide semiconductor layer 105, and annealing was performed at 950° C. for 60 seconds to form a first ohmic electrode 122 made of nickel silicide.

Figure 34:
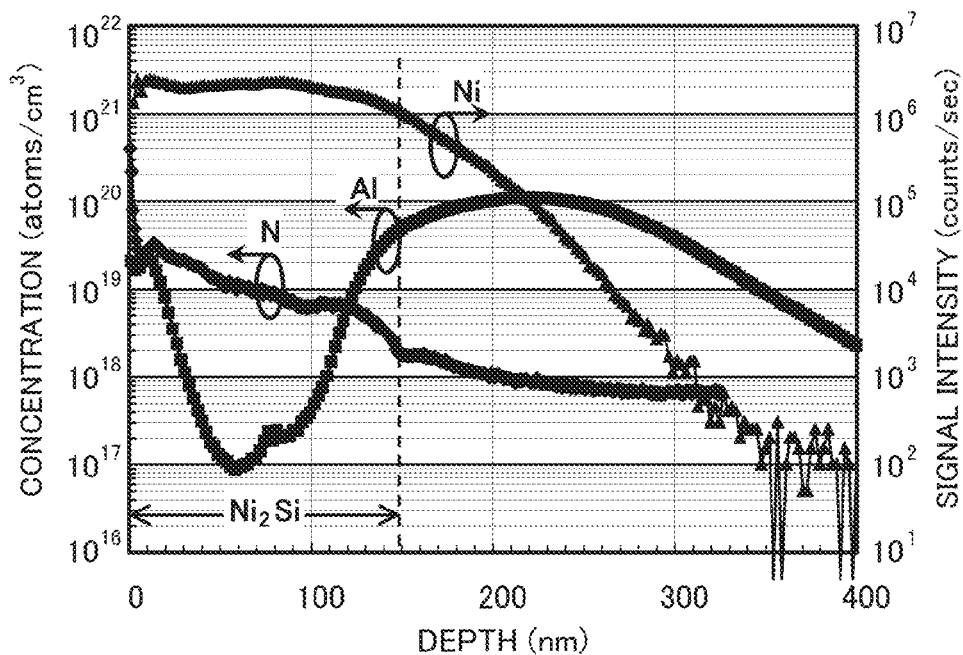
FIG. 34 is a graph illustrating an example distribution of each of aluminum and nitrogen in a source electrode and a contact region.

FIG. 34 illustrates the aluminum, nitrogen, and nickel concentration profiles of the first ohmic electrode 122 formed from the nickel film having a thickness of 100 nm. The concentration profiles were determined by SIMS. As illustrated in FIG. 34, the thickness of a nickel silicide layer serving as the first ohmic electrode 122, which was determined by the nickel concentration, was about 150 nm, which is about 1.5 times the thickness of the nickel film for use in silicidation.

After the removal of the gate insulating film, the thickness of the second silicon carbide semiconductor layer 105 was about 65 nm; therefore, when the thickness of the nickel film is 100 nm, not only the second silicon carbide semiconductor layer 105, but also a portion of the contact region 201 within about 35 nm from the surface thereof may be silicided.

The nitrogen concentration at the interface between the first ohmic electrode 122 and the contact region 201 was about $2 \times 10^{18}$ cm$^{-3}$, and the aluminum concentration thereat was about $6 \times 10^{19}$ cm$^{-3}$. The average nitrogen concentration in the first ohmic electrode 122 was $1.4 \times 10^{19}$ cm$^{-3}$, and the maximum nitrogen concentration therein was $3.3 \times 10^{19}$ cm$^{-3}$. The average aluminum concentration in a portion of the first ohmic electrode 122 except a portion thereof within 50 nm from the interface between the first ohmic electrode 122 and the contact region 201 was $3.0 \times 10^{18}$ cm$^{-3}$, and the maximum aluminum concentration therein was $2.4 \times 10^{19}$ cm$^{-3}$. In this case, the sheet resistance of the first ohmic electrode 122 was 0.5 Ω/sq.

Figure 35:
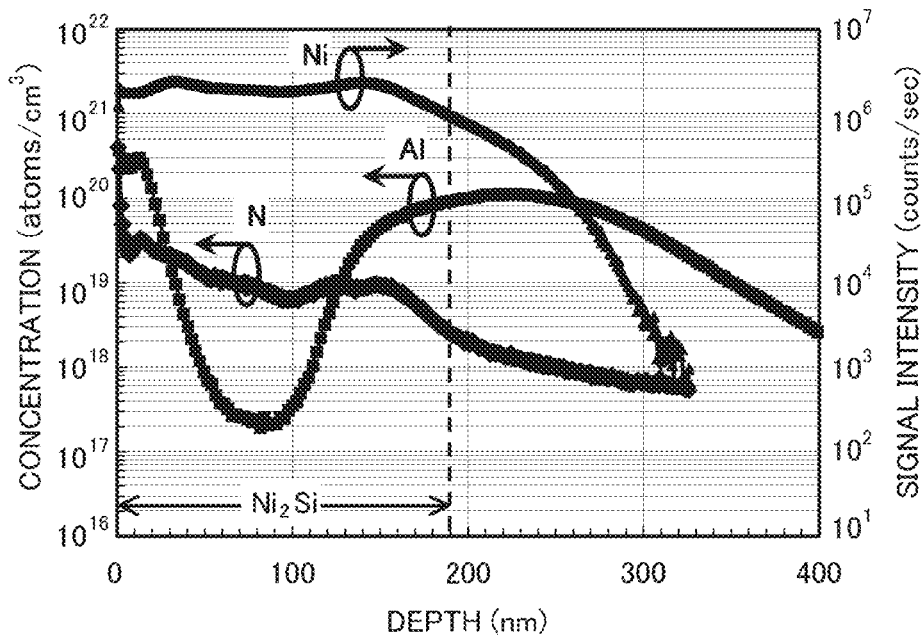
FIG. 35 is a graph illustrating an example distribution of each of aluminum and nitrogen in the source electrode and the contact region.

FIG. 35 illustrates the aluminum, nitrogen, and nickel concentration profiles of the first ohmic electrode 122 formed from the nickel film having a thickness of 125 nm. The thickness of a nickel silicide layer serving as the first ohmic electrode 122, which was determined by the nickel concentration, was about 190 nm, which is about 1.5 times the thickness of the nickel film for use in silicidation.

After the removal of the gate insulating film, the thickness of the second silicon carbide semiconductor layer 105 was about 65 nm; therefore, when the thickness of the nickel film is 125 nm, not only the second silicon carbide semiconductor layer 105, but also a portion of the contact region 201 within about 60 nm from the surface thereof may be silicided.

The nitrogen concentration at the interface between the first ohmic electrode 122 and the contact region 201 was about $2 \times 10^{18}$ cm$^{-3}$, and the aluminum concentration thereat was about $1 \times 10^{20}$ cm$^{-3}$. The average nitrogen concentration in the first ohmic electrode 122 was $1.3 \times 10^{19}$ cm$^{-3}$, and the maximum nitrogen concentration therein was $3.3 \times 10^{19}$ cm$^{-3}$. The average aluminum concentration in a portion of the first ohmic electrode 122 except a portion thereof within 50 nm from the interface between the first ohmic electrode 122 and the contact region 201 was $2.7 \times 10^{19}$ cm$^{-3}$, and the maximum aluminum concentration therein was $3.0 \times 10^{20}$ cm$^{-3}$. In this case, the sheet resistance of the first ohmic electrode 122 was 2 Ω/sq.

Figure 36:
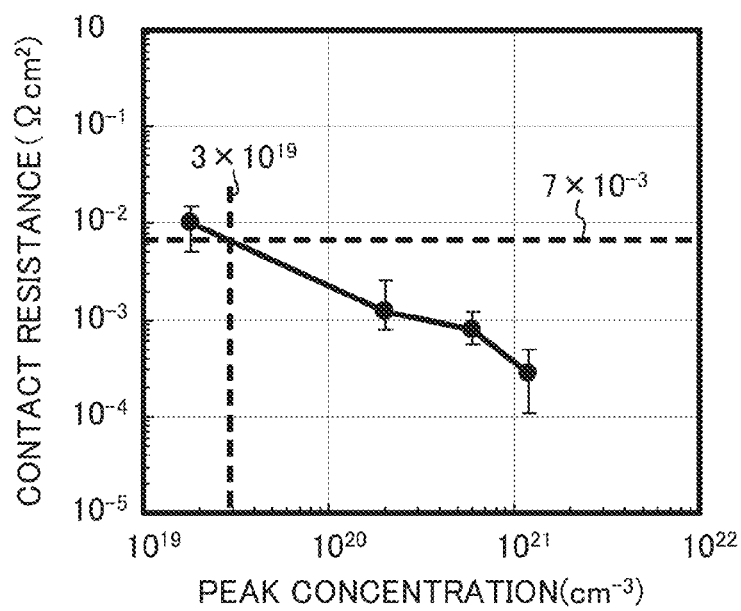
FIG. 36 is a graph illustrating the relationship between the aluminum concentration at the interface between the source electrode and the contact region and the contact resistance of a gate electrode.

As illustrated in FIGS. 34 and 35, with increasing aluminum concentration at the interface between the first ohmic electrode 122 and the contact region 201, the aluminum concentration in the surface of the first ohmic electrode 122 increases. This increases the sheet resistance of the first ohmic electrode 122. For this reason, to reduce the sheet resistance of the first ohmic electrode 122, the aluminum concentration at the interface is preferably low. For example, when the sheet resistance of a source electrode should be equal to or lower than 0.5 Ω/sq., the aluminum concentration at the interface merely needs to be equal to or lower than $2 \times 10^{19}$ cm$^{-3}$. In contrast, as illustrated in FIG. 36, to reduce the contact resistance of the first ohmic electrode 122, the aluminum concentration at the interface is preferably high. For example, when the contact resistance of the first ohmic electrode 122 should be equal to or lower than $7 \times 10^{-3}$ Ωcm$^2$, the aluminum concentration at the interface merely needs to be higher than or equal to $3 \times 10^{19}$ cm$^{-3}$. As illustrated in FIGS. 34 and 35, even when the thickness of the first ohmic electrode 122 varies, the aluminum concentration profile in the vicinity of the interface between the first ohmic electrode 122 and the contact region 201 does not significantly vary. Thus, on the basis of the profile in FIG. 34, the thickness of the first ohmic electrode 122 merely needs to be greater than or equal to about 130 nm to allow the aluminum concentration at the interface to be higher than or equal to $3 \times 10^{19}$ cm$^{-3}$. When, after the removal of the gate insulating film, the thickness of the second silicon carbide semiconductor layer 105 is about 65 nm, the thickness of the nickel film merely needs to be about 85 nm to allow the first ohmic electrode 122 to have a thickness of about 130 nm.

The present disclosure has been described based on the foregoing preferred embodiment. However, the embodiment does not limit the present disclosure, and may be variously changed or modified. While the example in which 4H—SiC is used was described, 6H—SiC may be used. While the example in which the semiconductor substrate made of silicon carbide is used was described, another substrate can be used. While the example in which after the contact holes 115 have been formed, the first ohmic electrodes 122 are formed was described, the first ohmic electrodes 122 may be formed before the deposition of the interlayer insulating film 109. While the example in which nickel is used as a metal forming the first ohmic electrodes 122 was described, any metal that can be combined with silicon to form a low-resistance alloy may be used. Thus, instead of nickel, titanium, aluminum, or any other metal may be used.

While a MISFET device was described, the present disclosure may be applied to an insulated gate bipolar transistor (IGBT) device. Such an IGBT device can be fabricated by allowing a semiconductor substrate and a semiconductor layer formed immediately above the semiconductor substrate to have different conductivity types. In this case, the second region corresponds to an emitter region or a collector region, the first ohmic electrode corresponds to an emitter electrode or a collector electrode, and the second ohmic electrode corresponds to a collector electrode or an emitter electrode.

In the embodiment, the substrate 101 made of 4H—SiC and the semiconductor layer 102 formed on the (0001) Si plane of the substrate 101 was illustrated. Alternatively, a first silicon carbide semiconductor layer 120 may be formed on a (000-1) C plane of the semiconductor substrate 101, and a second ohmic electrode 111 may be formed on the (0001) Si plane thereof. Otherwise, the plane direction of the principal surface of the semiconductor substrate 101 may be of another crystal plane. Further, another polytype SiC substrate may be used.

INDUSTRIAL APPLICABILITY

The semiconductor device of the present disclosure and the method for fabricating the same are useful as various semiconductor devices including, for example, power devices and methods for fabricating the same.

DESCRIPTION OF REFERENCE CHARACTERS 10, 11, 12, 13, 14, 15 SEMICONDUCTOR DEVICE
101 SEMICONDUCTOR SUBSTRATE
101a PRINCIPAL SURFACE
101b BACK SURFACE
102 DRIFT REGION
103 SECOND REGION
104 FIRST REGION
105 SECOND SILICON CARBIDE SEMICONDUCTOR LAYER
105a N-TYPE IMPURITY REGION
107 GATE INSULATING FILM
108 GATE ELECTRODE
109 INTERLAYER INSULATING FILM
110 INTERCONNECT
111 SECOND OHMIC ELECTRODE
115 CONTACT HOLE
120 FIRST SILICON CARBIDE SEMICONDUCTOR LAYER
120a UPPER SURFACE
122 FIRST OHMIC ELECTRODE
123 CONTACT METAL
140 CURRENT PATH REGION
160 JFET REGION
171a, 171b, 172, 173 IMPLANTATION MASK FEATURE
176, 177 PHOTORESIST
180, 184 ALUMINUM ION
182 NITROGEN ION OR PHOSPHORUS ION
185 NITROGEN ION
201 CONTACT REGION
201a P-TYPE REGION
201b N-TYPE REGION

The invention claimed is:

1. A semiconductor device comprising:
a first silicon carbide semiconductor layer;
a first impurity region having a p-type conductivity throughout, and provided in the first silicon carbide semiconductor layer; and
a first ohmic electrode forming ohmic contact with the first impurity region, wherein
the first ohmic electrode is a silicon alloy containing nitrogen,
an average concentration of nitrogen of the first ohmic electrode above an area where the first impurity region is in direct contact with the first ohmic electrode is higher than or equal to one half of an average concentration of nitrogen in the first impurity region, and is higher than or equal to $6.9 \times 10^{18}$ cm$^{-3}$, and
an average concentration of a p-type impurity in a portion of the first ohmic electrode except a portion of the first ohmic electrode within 50 nm from an interface between the first ohmic electrode and the first impurity region is equal to or lower than $3.0 \times 10^{18}$ cm$^{-3}$.

2. The semiconductor device of claim 1, wherein the p-type impurity is aluminum.

3. The semiconductor device of claim 1, wherein a concentration of the p-type impurity in a surface of the first ohmic electrode is lower than that of the p-type impurity at the interface between the first ohmic electrode and the first impurity region.

4. The semiconductor device of claim 1, wherein a maximum concentration of the p-type impurity in the portion of the first ohmic electrode except the portion of the first ohmic electrode within 50 nm from the interface between the first ohmic electrode and the first impurity region is equal to or lower than $2.4 \times 10^{19}$ cm$^{-3}$.

5. The semiconductor device of claim 1 further comprising:
a second silicon carbide semiconductor layer located on the first silicon carbide semiconductor layer without covering a portion of the first silicon carbide semiconductor layer on which the first ohmic electrode is formed, wherein
the second silicon carbide semiconductor layer contains nitrogen.

6. The semiconductor device of claim 5, wherein a portion of the second silicon carbide semiconductor layer functions as a channel.

7. The semiconductor device of claim 1 further comprising:
an n-type second impurity region adjacent to the first impurity region;
a third impurity region that has a p-type conductivity and is adjacent to the first and second impurity regions;
a gate electrode provided on the third impurity region with a gate insulating film interposed between the gate electrode and the third impurity region; and
a second ohmic electrode opposite to the first ohmic electrode with respect to the first silicon carbide semiconductor layer.

8. The semiconductor device of claim 1, wherein the first ohmic electrode is a nickel-silicon alloy containing nitrogen.

9. The semiconductor device of claim 1, wherein the first ohmic electrode is a titanium-silicon alloy containing nitrogen.

10. The semiconductor device of claim 7, wherein the third impurity region and the gate insulating film are in direct contact with each other.

11. The semiconductor device of claim 1, wherein a concentration of the p-type impurity at the interface between the first ohmic electrode and the first impurity region is higher than or equal to $3 \times 10^{19}$ cm$^{-3}$.

* * * * *